(12) United States Patent
Woo et al.

(10) Patent No.: US 12,713,948 B2
(45) Date of Patent: Aug. 18, 2026

(54) TRANSISTOR PACKAGE AND PROCESS OF IMPLEMENTING THE TRANSISTOR PACKAGE

(71) Applicant: WOLFSPEED, INC., Durahm, NC (US)

(72) Inventors: Eng Wah Woo, Ipoh (MY); Soon Lee Liew, Ipoh (MY); Alexander Komposch, Morgan Hill, CA (US); Arthur Pun, Raleigh, CA (US)

(73) Assignee: Wolfspeed, Inc., Durham, NC (US)

( * ) Notice: Subject to any disclaimer, the term of this patent is extended or adjusted under 35 U.S.C. 154(b) by 862 days.

(21) Appl. No.: 17/951,527

(22) Filed: Sep. 23, 2022

(65) Prior Publication Data

US 2024/0105570 A1 Mar. 28, 2024

(51) Int. Cl.

| | |
|---|---|
| ***H01L 23/498*** | (2006.01) |
| ***H10W 70/63*** | (2026.01) |
| ***H10W 74/10*** | (2026.01) |
| *H10W 90/00* | (2026.01) |

(52) U.S. Cl.
CPC ........ *H10W 70/635* (2026.01); *H10W 74/114* (2026.01); *H10W 90/724* (2026.01); *H10W 90/754* (2026.01)

(58) Field of Classification Search
None
See application file for complete search history.

(56) References Cited

U.S. PATENT DOCUMENTS

| | | | |
|---|---|---|---|
| 34,861 | A | 4/1862 | Knowlton |
| 4,946,547 | A | 8/1990 | Palmour et al. |
| 5,192,987 | A | 3/1993 | Khan et al. |
| 5,200,022 | A | 4/1993 | Kong et al. |
| 5,210,051 | A | 5/1993 | Carter |
| 5,296,395 | A | 3/1994 | Khan et al. |
| 5,309,012 | A | 5/1994 | Jex et al. |
| RE34,861 | E | 2/1995 | Davis et al. |
| 5,393,993 | A | 2/1995 | Edmond et al. |
| 5,523,589 | A | 6/1996 | Edmond et al. |

(Continued)

FOREIGN PATENT DOCUMENTS

| | | |
|---|---|---|
| CA | 2511005 C | 5/2016 |
| CN | 1412838 A | 4/2003 |

(Continued)

OTHER PUBLICATIONS

U.S. Appl. No. 63/004,985, filed Apr. 3, 2020, Marbell et al.

(Continued)

*Primary Examiner* — Long Pham
(74) *Attorney, Agent, or Firm* — BakerHostetler

(57) ABSTRACT

A device includes at least one semiconductor device; a package support configured to support the at least one semiconductor device; electrical connection portions having at least one of the following: electrical connection portions extending from the package support, electrical connection portions configured as a bond wire device connection, electrical connection portions configured as a bump ball connection, and/or electrical connection portions configured as a stud bump connection. Where the electrical connection portions connect between the at least one semiconductor device and the package support.

29 Claims, 20 Drawing Sheets

(56) References Cited

U.S. PATENT DOCUMENTS 6,218,680 B1 4/2001 Carter et al.
6,316,793 B1 11/2001 Sheppard et al.
6,426,525 B1 7/2002 Brindle
6,548,333 B2 4/2003 Smith
6,825,559 B2 11/2004 Mishra et al.
7,030,428 B2 4/2006 Saxler
7,078,310 B1 7/2006 Kar-Roy et al.
7,135,766 B1 11/2006 Costa et al.
7,259,402 B2 8/2007 Edmond et al.
7,291,529 B2 11/2007 Slater, Jr. et al.
7,354,782 B2 4/2008 Mishra et al.
7,544,963 B2 6/2009 Saxler
7,548,112 B2 6/2009 Sheppard
7,592,211 B2 9/2009 Sheppard et al.
7,615,774 B2 11/2009 Saxler
7,709,269 B2 5/2010 Smith et al.
7,768,075 B2 8/2010 Yilmaz et al.
7,851,909 B2 12/2010 Mishra et al.
7,906,799 B2 3/2011 Sheppard et al.
7,932,111 B2 4/2011 Edmond
8,138,087 B2 3/2012 Morel et al.
8,143,699 B2 3/2012 Ching et al.
8,252,682 B2 8/2012 Yang et al.
8,274,159 B2 9/2012 Mishra et al.
8,513,686 B2 8/2013 Edmond
8,803,313 B2 8/2014 Mishra et al.
8,828,860 B2 * 9/2014 Gruber ................ H01L 21/4853 438/612
9,153,504 B2 10/2015 Lai et al.
9,226,383 B2 12/2015 Mishra et al.
9,252,120 B2 * 2/2016 Nah ...................... H01L 21/563
9,295,166 B2 * 3/2016 Gruber ................. H05K 3/3494
9,515,011 B2 12/2016 Wood et al.
9,780,738 B2 10/2017 Ota
9,812,429 B2 * 11/2017 Das ................... H01L 23/49838
9,947,616 B2 4/2018 Wood et al.
9,966,426 B2 5/2018 Mudakatte et al.
10,103,233 B1 10/2018 Khalil et al.
10,147,686 B1 12/2018 Lessard et al.
10,290,701 B1 5/2019 Chang
10,483,352 B1 11/2019 Mokhti et al.
10,574,198 B2 2/2020 Shilimkar et al.
11,094,614 B2 8/2021 Steinhoff
11,257,740 B2 2/2022 Komposch et al.
11,990,872 B2 5/2024 Tucker et al.
12,230,614 B2 2/2025 Marbell et al.
2001/0038310 A1 11/2001 Olofsson et al.
2002/0066908 A1 6/2002 Smith et al.
2002/0167023 A1 11/2002 Chavarkar et al.
2003/0102482 A1 6/2003 Saxler
2003/0155661 A1 8/2003 Auburger et al.
2004/0056277 A1 3/2004 Karnezos
2004/0061129 A1 4/2004 Saxler et al.
2004/0061214 A1 4/2004 Crescenzi
2004/0130037 A1 7/2004 Mishra et al.
2005/0040522 A1 2/2005 Takehara et al.
2005/0121744 A1 6/2005 Chang et al.
2005/0230797 A1 10/2005 Ho et al.
2006/0081985 A1 4/2006 Beach et al.
2006/0226498 A1 10/2006 Davies
2007/0290310 A1 12/2007 Kusano et al.
2007/0297120 A1 12/2007 Ren et al.
2008/0083954 A1 4/2008 Tokunaga
2008/0169474 A1 7/2008 Sheppard
2009/0256266 A1 10/2009 Lao et al.
2010/0059791 A1 3/2010 Takagi
2010/0059879 A1 3/2010 Bielen
2010/0178879 A1 7/2010 Sato et al.
2010/0244193 A1 9/2010 Lin et al.
2011/0024835 A1 2/2011 Tiemeijer
2011/0031586 A1 2/2011 Kang et al.
2011/0233762 A1 * 9/2011 Gruber .................. H01L 21/486 257/737
2011/0241074 A1 10/2011 Okamoto
2012/0063097 A1 3/2012 Reza et al.
2012/0104427 A1 5/2012 Chan et al.
2012/0104577 A1 5/2012 Fukumura et al.
2012/0139095 A1 6/2012 Manusharow et al.
2012/0140432 A1 6/2012 Andrei
2012/0167033 A1 6/2012 Cases et al.
2012/0168928 A1 7/2012 Lao et al.
2012/0256189 A1 10/2012 McDonald et al.
2012/0280755 A1 11/2012 Wright
2013/0264716 A1 10/2013 Lin et al.
2013/0284507 A1 10/2013 Hattori et al.
2013/0341656 A1 12/2013 Chan et al.
2014/0036405 A1 2/2014 Takeoka et al.
2014/0264799 A1 9/2014 Gowda et al.
2014/0312458 A1 10/2014 Ashrafzadeh et al.
2014/0332941 A1 11/2014 Viswanathan et al.
2014/0346569 A1 11/2014 Vielemeyer et al.
2015/0244410 A1 8/2015 Leong et al.
2015/0249021 A1 9/2015 Sanchez et al.
2015/0303881 A1 10/2015 Blednov et al.
2015/0310981 A1 10/2015 Yen et al.
2016/0087588 A1 3/2016 Szymanowski et al.
2016/0090294 A1 3/2016 Wachter et al.
2016/0126173 A1 5/2016 Kim et al.
2016/0126905 A1 5/2016 Zhao et al.
2016/0240471 A1 8/2016 Klowak et al.
2017/0034913 A1 2/2017 Mu et al.
2017/0117239 A1 4/2017 Lembeye et al.
2017/0243812 A1 8/2017 Kadoguchi et al.
2017/0271258 A1 9/2017 Wood et al.
2017/0271497 A1 9/2017 Fayed et al.
2017/0287820 A1 10/2017 Ahlers et al.
2017/0372945 A1 12/2017 Howard et al.
2017/0372983 A1 12/2017 Howard
2017/0373645 A1 12/2017 Jang et al.
2018/0040537 A1 2/2018 Grassmann et al.
2018/0090475 A1 3/2018 Zuo et al.
2018/0096922 A1 4/2018 Chen
2018/0114741 A1 4/2018 Gagnéet al.
2018/0122750 A1 5/2018 Lu
2018/0131329 A1 5/2018 Tong
2018/0175802 A1 6/2018 Wu et al.
2018/0182717 A1 6/2018 Shilimkar et al.
2018/0323159 A1 11/2018 Kamgaing et al.
2018/0323295 A1 11/2018 Okayasu et al.
2019/0057924 A1 2/2019 Kim et al.
2019/0109222 A1 4/2019 Liu et al.
2019/0110358 A1 4/2019 Mu et al.
2019/0149098 A1 5/2019 Tanomura
2019/0173195 A1 6/2019 Kim et al.
2019/0173430 A1 6/2019 Krehbiel et al.
2019/0181099 A1 6/2019 Then et al.
2019/0280374 A1 9/2019 Kim et al.
2019/0304887 A1 10/2019 Ganesan et al.
2019/0326233 A1 10/2019 Uscola
2019/0326258 A1 10/2019 Hua et al.
2019/0333878 A1 10/2019 Wu et al.
2020/0013692 A1 1/2020 Formicone
2020/0021046 A1 1/2020 Kermalli et al.
2020/0027849 A1 1/2020 Trang et al.
2020/0075479 A1 3/2020 Khalil et al.
2020/0091608 A1 3/2020 Alpman et al.
2020/0105653 A1 4/2020 Elsherbini et al.
2020/0105741 A1 4/2020 Lin et al.
2020/0204119 A1 6/2020 Roberts et al.
2020/0219866 A1 7/2020 Cabahug et al.
2020/0227366 A1 7/2020 Dogiamis et al.
2020/0328721 A1 10/2020 Nanan et al.
2020/0395474 A1 12/2020 Bothe et al.
2020/0411555 A1 12/2020 Hall et al.
2021/0028122 A1 1/2021 Son et al.
2021/0111105 A1 4/2021 Kim et al.
2021/0118835 A1 4/2021 Wu et al.
2021/0126593 A1 4/2021 Roberts et al.
2021/0175860 A1 6/2021 Roberts et al.
2021/0175866 A1 6/2021 Li et al.
2021/0194434 A1 6/2021 Ladhani et al.
2021/0202408 A1 7/2021 Khalil et al.
2021/0225784 A1 7/2021 Shilimkar et al.
2021/0265249 A1 8/2021 Komposch et al.

(56) References Cited

U.S. PATENT DOCUMENTS

| | | | |
|---|---|---|---|
| 2021/0265250 A1 | 8/2021 | Marbell et al. | |
| 2021/0313282 A1 | 10/2021 | Noori et al. | |
| 2021/0313284 A1 | 10/2021 | Noori et al. | |
| 2021/0313285 A1 | 10/2021 | Noori et al. | |
| 2021/0313293 A1 | 10/2021 | Noori et al. | |
| 2021/0336585 A1 | 10/2021 | Mares et al. | |
| 2021/0376807 A1 | 12/2021 | Lim et al. | |
| 2021/0391234 A1 | 12/2021 | Lan et al. | |
| 2022/0059427 A1 | 2/2022 | Kondo et al. | |
| 2022/0084950 A1 | 3/2022 | Noori et al. | |
| 2022/0321071 A1 | 10/2022 | Noori et al. | |
| 2023/0260935 A1 | 8/2023 | Kabir et al. | |
| 2023/0361726 A1 | 11/2023 | Schultz et al. | |
| 2024/0047324 A1* | 2/2024 | Hwang | H01L 21/565 |
| 2024/0047408 A1* | 2/2024 | Eitan | H01L 23/49827 |
| 2024/0096812 A1* | 3/2024 | Wu | H01L 21/56 |

FOREIGN PATENT DOCUMENTS

| | | | |
|---|---|---|---|
| CN | 1757119 | B | 2/2011 |
| CN | 104051376 | A | 9/2014 |
| CN | 204946885 | U | 1/2016 |
| CN | 110970423 | A | 4/2020 |
| EP | 1357596 | A2 | 10/2003 |
| EP | 1670055 | A1 | 6/2006 |
| EP | 2518764 | A2 | 10/2012 |
| EP | 2947472 | A1 | 11/2015 |
| EP | 3629373 | A1 | 4/2020 |
| EP | 3855486 | A1 | 7/2021 |
| EP | 3907756 | A1 | 11/2021 |
| JP | S64-013144 | U | 1/1989 |
| JP | H10-004325 | A | 1/1998 |
| JP | 2002-093920 | A | 3/2002 |
| JP | 2003-124435 | A | 4/2003 |
| JP | 2006-086296 | A | 3/2006 |
| JP | 4830092 | B2 | 12/2011 |
| JP | 2013-546191 | A | 12/2013 |
| JP | 2014-179612 | A | 9/2014 |
| JP | 2016-009697 | A | 1/2016 |
| JP | 2016-219542 | A | 12/2016 |
| JP | 2019-186983 | A | 10/2019 |
| JP | 6615414 | B1 | 12/2019 |
| JP | 2020-507230 | A | 3/2020 |
| KR | 2006-0103395 | A | 9/2006 |
| KR | 2012-0102819 | A | 9/2012 |
| KR | 101288153 | B1 | 7/2013 |
| KR | 101371907 | B1 | 3/2014 |
| KR | 2017-0077133 | A | 7/2017 |
| KR | 2018-0019226 | A | 2/2018 |
| TW | I333278 | B | 11/2010 |
| TW | 201519379 | A | 5/2015 |
| WO | WO 1999/054935 | A1 | 10/1999 |
| WO | WO 2004/061973 | A1 | 7/2004 |
| WO | WO 2009/097564 | A1 | 8/2009 |
| WO | WO 2017/187559 | A1 | 11/2017 |
| WO | WO 2019/066878 | A1 | 4/2019 |
| WO | WO 2019/097564 | A1 | 5/2019 |
| WO | WO 2019/170045 | A1 | 9/2019 |
| WO | WO 2020/100219 | A1 | 5/2020 |
| WO | WO 2021/167822 | A1 | 8/2021 |
| WO | WO 2021/202076 | A1 | 10/2021 |
| WO | WO 2022/078725 | A1 | 4/2022 |

OTHER PUBLICATIONS

The definition of Redistribution Layers (RDLs), https://semiengineering.com/knowledge_centers/packaging/ redistribution-layers-rdls/; Semiconductor Engineering; © 2013; accessed Nov. 20, 2025; 5 pages.

Jin et al.; "Next generation eWIB (embedded wafer level BGA) packaging": 12th Electronics Packaging Technology Conference; 2010; p. 520-526.

* cited by examiner

TRANSISTOR PACKAGE AND PROCESS OF IMPLEMENTING THE TRANSISTOR PACKAGE

FIELD OF THE DISCLOSURE

The disclosure relates to a transistor package. The disclosure further relates to a process of implementing a transistor package.

BACKGROUND OF THE DISCLOSURE

Transistor packages such as a radio frequency (RF) transistor package, a radio frequency (RF) power amplifier transistor package, a power transistor package, and/or the like are typically mounted on printed circuit board (PCB) using copper pillars arranged on a transistor or solder bumps/solder balls arranged on the transistor. For example, FIG. 18 illustrates a typical transistor package having a mold compound, a transistor chip, and copper pillars. In particular, the copper pillars must be formed and attached to the transistor chip. Thereafter, the typical transistor package is electrically connected to a printed circuit board (PCB) by solder arranged between the copper pillars and the printed circuit board (PCB).

As another example, FIG. 19 illustrates another implementation of a typical transistor package having a mold compound, a transistor chip, and solder bumps. In particular, the solder bumps must be formed and attached to the transistor chip. This typical transistor package is electrically connected to a printed circuit board (PCB) by the solder bumps arranged on the transistor chip. FIG. 20 illustrates a typical manufacturing process of implementing the typical transistor package according to FIG. 19. In particular, FIG. 20 illustrates steps of flux dispensing, chip placement, solder reflow, cleansing, underfill dispensing, and underfill cure.

However, the typical transistor package as described above requires a costly and lengthy manufacturing process including the steps of flux dispensing, chip placement, solder reflow, cleansing, underfill dispensing, and underfill cure. Moreover, the typical transistor package as described above also limits a size and an arrangement of the connections including a size and an arrangement the copper pillars, the solder, the solder bumps, and/or the like.

Accordingly, what is needed is a transistor package implementing electrical connections that utilize a less costly manufacturing process, a shorter manufacturing process, and/or the like. Moreover, what is needed is a transistor package implementing electrical connections that utilize a smaller size, greater arrangement flexibility, and/or the like.

SUMMARY OF THE DISCLOSURE

In one general aspect, a package includes at least one semiconductor device. The package in addition includes a package support configured to support the at least one semiconductor device. The package moreover includes electrical connection portions having at least one of the following: electrical connection portions extending from the package support, electrical connection portions configured as a bond wire device connection, electrical connection portions configured as a bump ball connection, and/or electrical connection portions configured as a stud bump connection. The package also includes where the electrical connection portions connect between the at least one semiconductor device and the package support.

In one general aspect, a process includes providing at least one semiconductor device. The process in addition includes configuring a package support to support the at least one semiconductor device. The process moreover includes configuring electrical connection portions having at least one of the following: electrical connection portions extending from the package support, electrical connection portions configured as a bond wire device connection, electrical connection portions configured as a bump ball connection, and/or electrical connection portions configured as a stud bump connection. The process also includes where the electrical connection portions connect between the at least one semiconductor device and the package support.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 4 further illustrates the package support of the package during a second intermediate processing step according to the disclosure.

FIG. 5 further illustrates the package support of the package during a fourth intermediate processing step according to the disclosure.

FIG. 6 further illustrates the package support of the package during a sixth intermediate processing step according to the disclosure.

DETAILED DESCRIPTION OF THE DISCLOSURE

Figure 1:
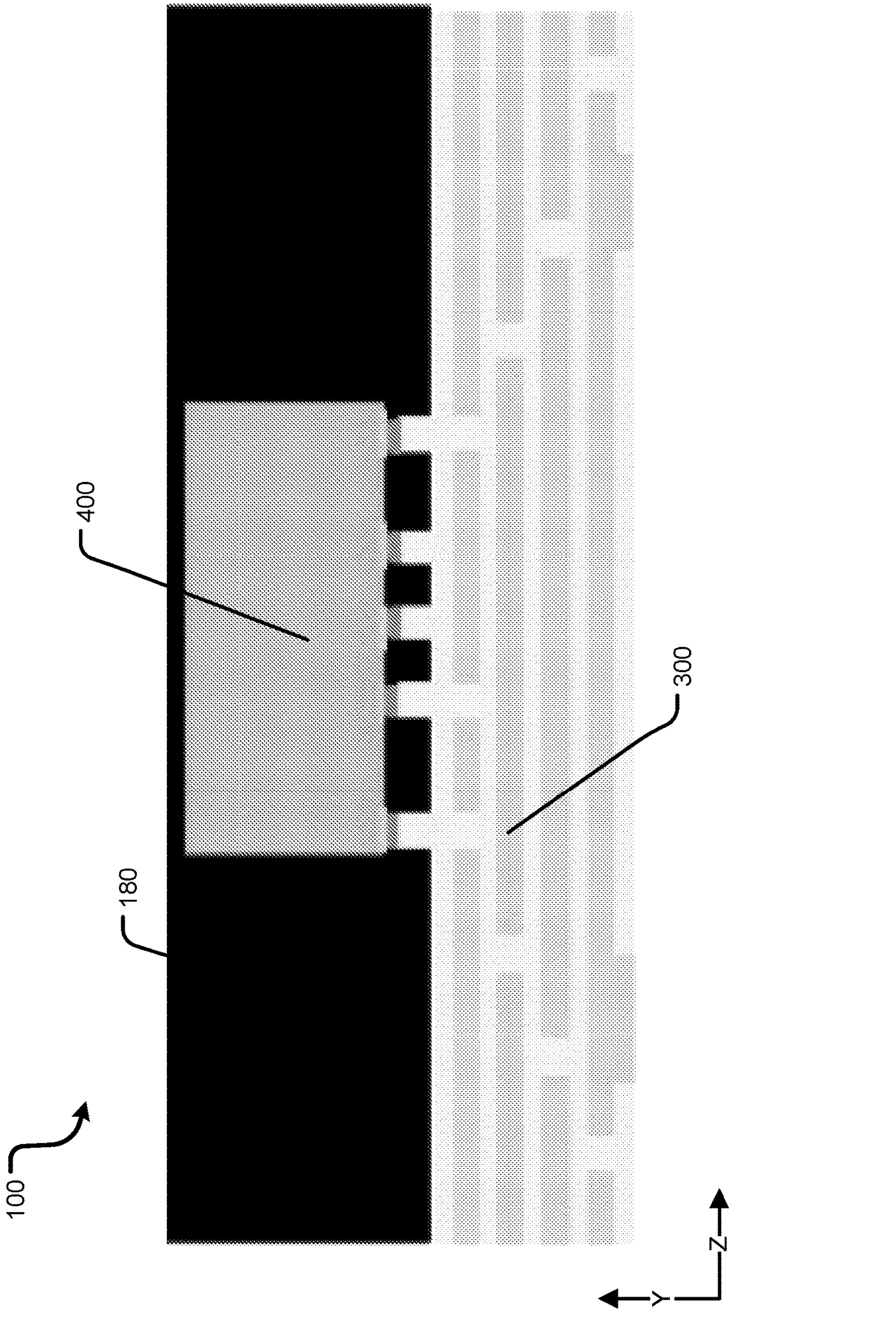
FIG. 1 illustrates a cross-sectional view of a package according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The disclosure is directed to a device and process to attach an active device, such as a GaN SiC transistor, on a substrate, such as a PCB. In aspects, the disclosure is directed to a device and process to attach an active device with a flip chip configuration, such as a GaN SiC transistor, on a substrate, such as a PCB. The disclosed device and process may be utilized in any type of packaged transistor implementation including RF power products, power products, and/or the like.

In aspects, the disclosed device and process may implement a package technology for an active device, such as GaN on SiC, which may connect to PCB via a pillar configuration. In aspects, the disclosed device and process may implement a package technology for an active device with a flip chip configuration, such as GaN on SiC flip chip, which may connect to PCB via a pillar configuration. In aspects, the disclosed device and process may include growth of a pillar from a solid metal block of a PCB. In aspects, the disclosed device and process may further implement solder printing on the pillar from the solid metal block of a PCB. In aspects, the disclosed device and process may include flip chip pad attach to the metal block location and reflow. The disclosed device and process may include numerous advantages that the metal to metal pitch can be closer, cost advantages due to a shorter process, and/or the like.

In aspects, the disclosed device and process may implement a PCB solder masking process, an etch process, a metal plate up process, an etch off process for the solder mask, and/or the like to expose a formed metal pillar. In aspects, the disclosed device and process may further implement a solder print on top of the metal pillar, a flip die and attach process, which may place the metal pillar with solder print contact to a die bond pad, and a reflow configuration to form the connection.

In aspects, the disclosed device and process may implement and/or may utilize a bond wire, such as a thicker copper (Cu) wire, to bond a vertical wire from a substrate pad. In aspects, the disclosed device and process may further apply a solder paste at a vertical wire tip. In aspects, the disclosed device and process may further implement a flip chip pad attach to the vertical wire tip and reflow the solder.

In aspects, the disclosed device and process may create a bump ball, such as a copper bump ball, at a flip chip pad. In aspects, the disclosed device and process may further apply solder on a top of a top ball. In aspects, the disclosed device and process may further implement a flip chip process that may face down the chip thereon and attach to the substrate paddle and reflow.

In aspects, the disclosed device and process may create a stud bump, such as a gold (Au) stud bump at a flip chip and a substrate paddle respectively. Both of the stud bumps may be attached with an application pressure process.

FIG. 1 illustrates a cross-sectional view of a package according to the disclosure.

Figure 2:
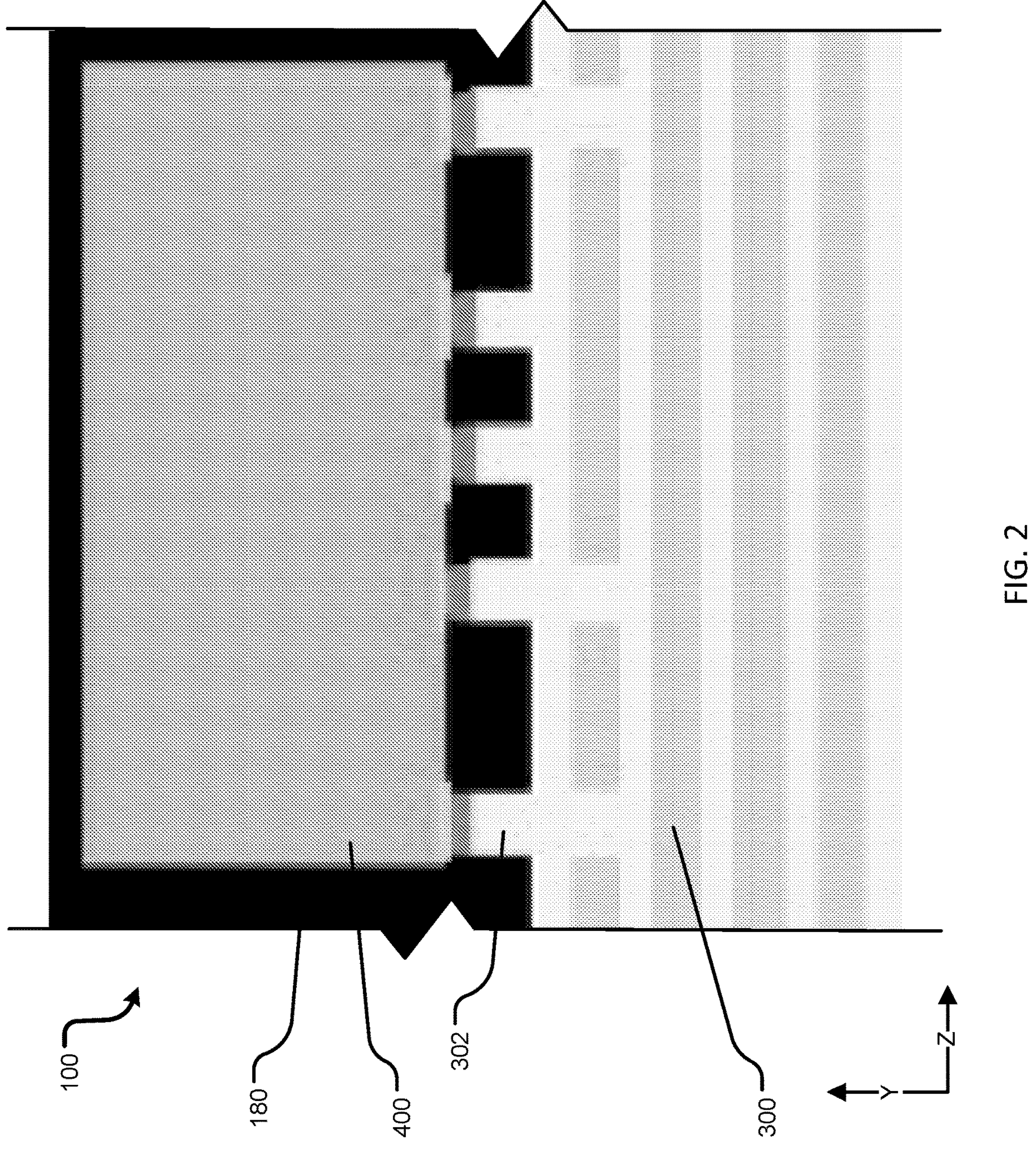
FIG. 2 illustrates a further cross-sectional view of the package according to FIG. 1.

FIG. 2 illustrates a further cross-sectional view of the package according to FIG. 1.

Figure 3:
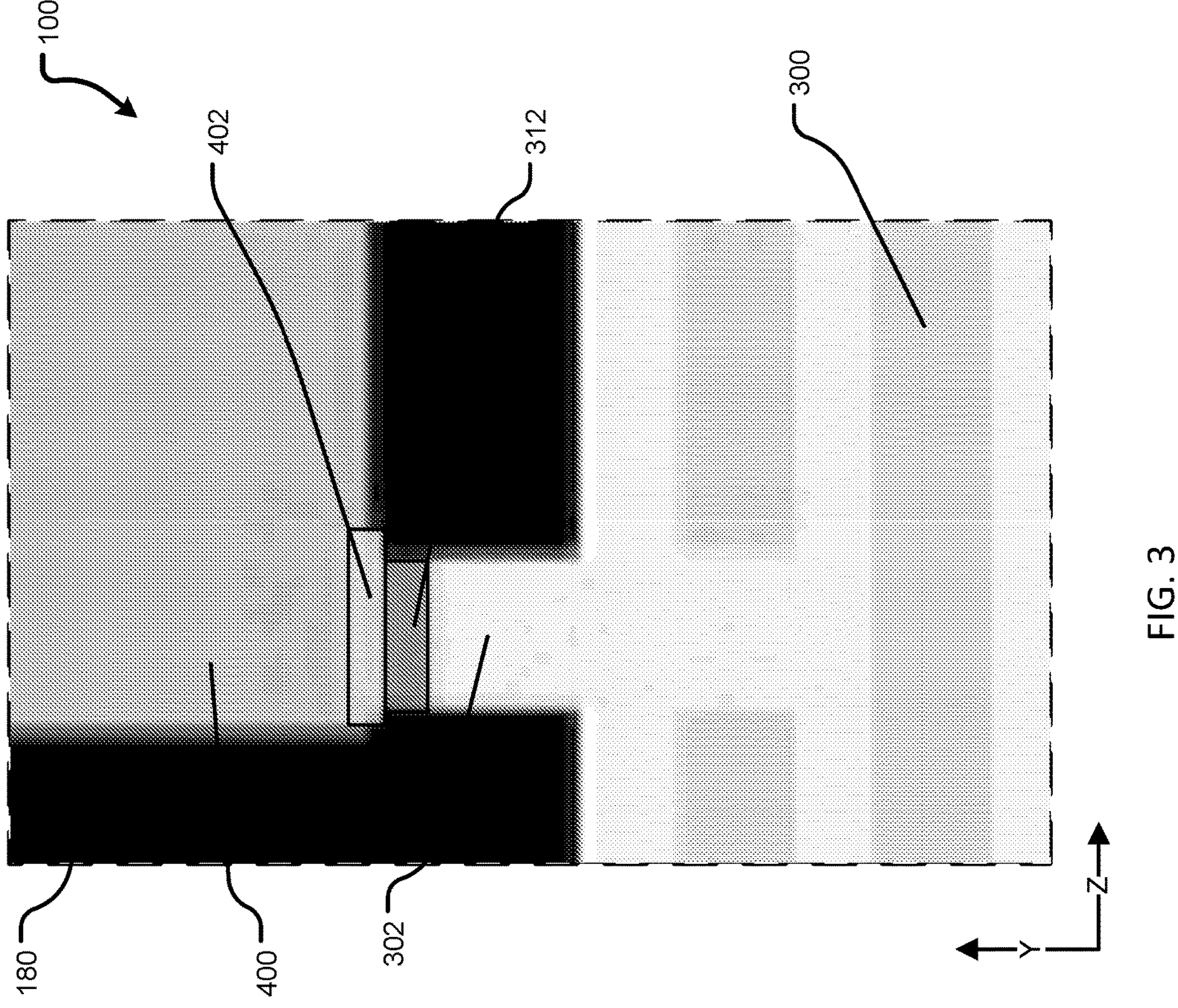
FIG. 3 illustrates yet a further cross-sectional view of the package according to FIG. 1.

FIG. 3 illustrates yet a further cross-sectional view of the package according to FIG. 1.

The aspects of FIG. 1, FIG. 2, and FIG. 3 may include any one or more features as described herein. In particular, FIG. 1, FIG. 2, and FIG. 3, show an exemplary implementation of a package 100 that may include any one or more other features, components, arrangements, and the like as described herein. In particular, FIG. 1 illustrates the package 100 that may be implemented as a RF package, a RF amplifier package, a RF power amplifier package, a RF power transistor package, a RF power amplifier transistor package, a power transistor package, and/or the like as described herein.

With reference to FIG. 1, the package 100 may include at least one semiconductor device 400, a package support 300, and an over-mold 180. In aspects, the package 100 may implement the at least one semiconductor device 400 as a flip chip. In aspects, the at least one semiconductor device 400 implemented as a flip chip may be a flip chip transistor, which could include a die flipped from its growth substrate orientation. In this regard, in aspects to mount the at least one semiconductor device 400 to the package support 300, the at least one semiconductor device 400 may be flipped over so that a top side of the at least one semiconductor device 400 faces down. However, in other aspects, the at least one semiconductor device 400 may not be implemented as a flip chip.

With reference to FIG. 2, the package 100 may further include electrical connection portions 302 extending up from the package support 300. The electrical connection portions 302 may extend along the y-axis to make an electrical connection with the at least one semiconductor device 400. In aspects, the y-axis may be a vertical axis. In this regard, the electrical connection portions 302 may be configured as part of the package support 300; the electrical connection portions 302 may be performed in part from the package support 300; the electrical connection portions 302 may be an extension of structure of the package support 300, and/or the like.

With reference to FIG. 3, the package 100 may include a solder connection 312 arranged between the electrical connection portions 302 and the at least one semiconductor device 400. In particular, the solder connection 312 may be located on a tip of the electrical connection portions 302 of the package support 300. Further, the at least one semiconductor device 400 may include electrical contact pads 402 and respective implementations of the electrical connection portions 302 may connect to respective implementations the electrical contact pads 402 of the at least one semiconductor device 400 by the solder connection 312.

In aspects, the disclosed device and process may implement the package 100 with a package technology for the at least one semiconductor device 400, which may connect to the package support 300 via a pillar configuration implemented by the electrical connection portions 302. In aspects, the disclosed device and process may implement the package 100 with a package technology for the at least one semiconductor device 400 with a flip Chip configuration, which may connect to a pillar configuration implemented by the electrical connection portions 302. In aspects, the disclosed device and process may include growth of a pillar from solid metal block of the package support 300 to form the electrical connection portions 302. In aspects, the disclosed device and process may further include solder printing to form the solder connection 312 on the electrical connection portions 302 that may be formed as the pillar from the solid metal block of the package support 300. In aspects, the disclosed device and process, the solder connection 312 may be implemented with a plated solder connection or plated solder portion. In aspects, the plated solder portion may be arranged on top of the electrical connection portions 302. In aspects, the plated solder portion may be arranged on top of the electrical connection portions 302 using front end equipment.

In aspects, the disclosed device and process relating to the package 100 may include flip chip pad attach of the electrical contact pads 402 of the at least one semiconductor device 400 to the metal block location of the electrical connection portions 302. In aspects, the disclosed device and process relating to the package 100 may reflow a solder associated with the solder connection 312.

In aspects, a distance or pitch between implementations of the electrical connection portions 302 may be much less than prior art connections. Accordingly, more connections can be implemented per unit area of the package 100. The disclosed device and process may include numerous advantages that the metal to metal pitch can be closer, cost advantages due to shorter process, and/or the like.

In aspects, the disclosed device and process may implement a PCB solder masking process for the package support 300, etch process for the package support 300, metal plate up process for the package support 300, etch off process for the solder mask, and/or the like for the package support 300 to expose a formed metal pillar that is the electrical connection portions 302 of the package support 300. In aspects, the disclosed device and process may further implement a solder print on a top of the metal pillar that is the electrical connection portions 302 to form the solder connection 312.

In aspects, the disclosed device and process may further implement a flip die and attach process for flipping the at least one semiconductor device 400 and attaching the at least one semiconductor device 400 to the package support 300, which may place the metal pillar implemented by the electrical connection portions 302 with solder print that may subsequently form the solder connection 312 to a die bond pad that is the electrical contact pads 402 of the at least one semiconductor device 400. In aspects, the disclosed device and process may further implement a reflow process to reflow a solder of the solder connection 312 to form the connection between the electrical connection portions 302 of the package support 300 and the electrical contact pads 402 of the at least one semiconductor device 400.

In aspects, the at least one semiconductor device 400 may be implemented a gallium nitride (GaN) silicon carbide (SiC) transistor. In aspects, the at least one semiconductor device 400 may be implemented as one or more of a wide band-gap semiconductor device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration, and/or the like.

In aspects, the package 100 may be configured as an over-mold package. The over-mold 180 may substantially surround the at least one semiconductor device 400, which may be mounted on the package support 300. The over-mold 180 may be formed of a plastic, a mold compound, a plastic compound, a polymer, a polymer compound, a plastic polymer compound, an epoxy compound, a silicone compound, and/or the like. The over-mold 180 may be injection molded, transfer molded, and/or compression molded around the at least one semiconductor device 400, and other components of the package 100 from the outside environment. The over-mold 180 may include underfill between the at least one semiconductor device 400 and the package support 300. In aspects, the over-mold 180 may be implemented with different materials, may be applied in one or more different steps, and/or the like. In aspects, the over-mold 180 may be implemented with different materials, may be applied in one or more different steps, and/or the like for a portion of the underfill and a portion around the at least one semiconductor device 400. In aspects, the over-mold 180 may be implemented first with a different softer material for a portion of the underfill to reduce components of the package 100, such as the at least one semiconductor device 400, from being dislocated, disconnected, popped, and/or the like when exposed to higher temperatures due to a coefficient of thermal expansion (CTE) of various components of the package 100; and a portion around the at least one semiconductor device 400 may include a harder material.

In aspects, the package support 300 may be implemented as a printed circuit board (PCB), a printed wiring board (PWB), a printed circuit board assembly (PCBA), a medium used to connect electronic components to one another in a controlled manner, and/or the like. In aspects, the package support 300 may be implemented as a laminated sandwich structure of one or more conductive and insulating layers. In aspects, the package support 300 may include one or more conductive layers, traces, planes and/or the like. In aspects, the package support 300 may be etched from one or more sheet layers of copper laminated onto and/or between sheet layers of a non-conductive substrate. In aspects, the package support 300 may include plated-through holes that allow interconnections between layers.

Figure 4:
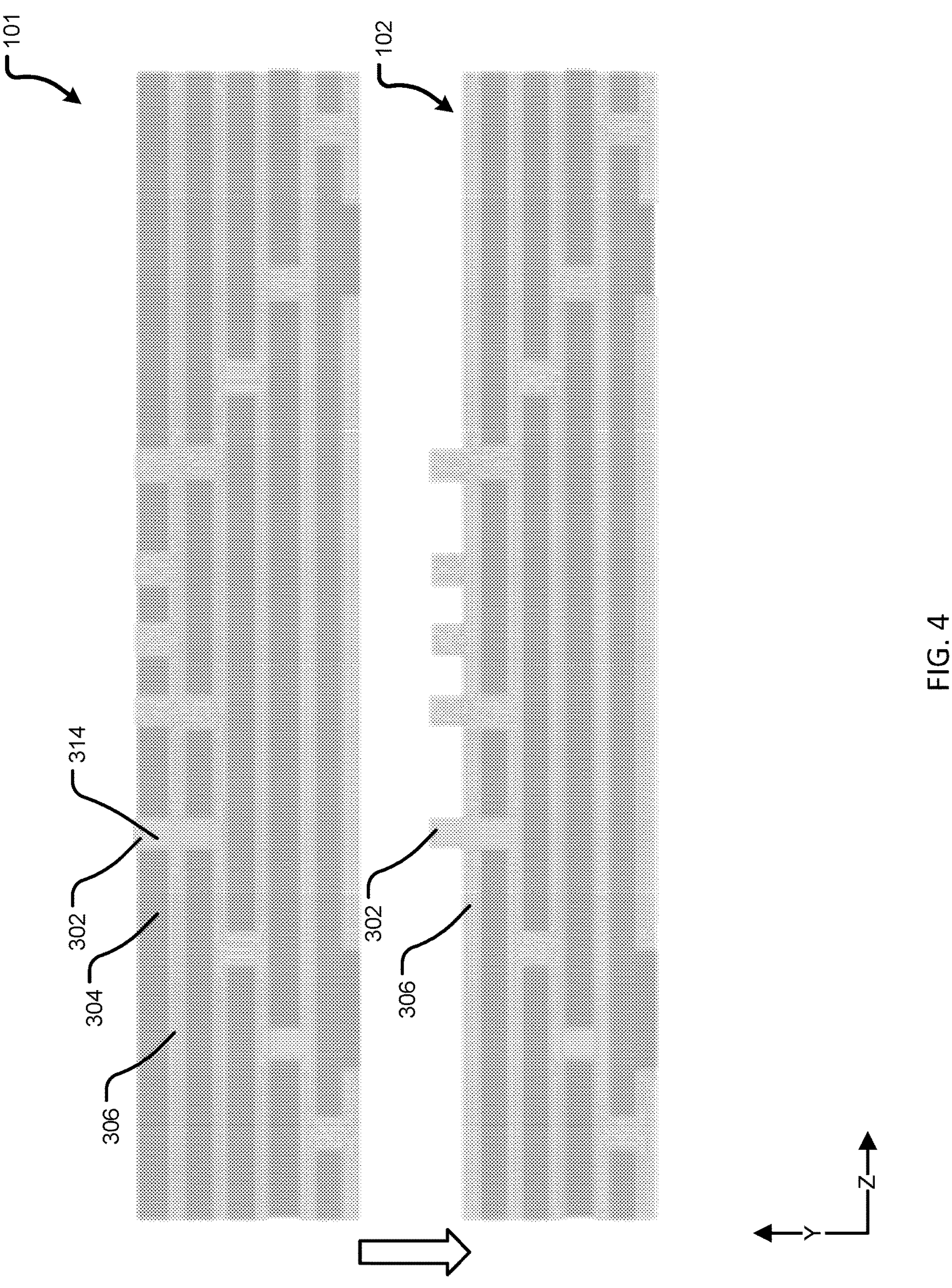
FIG. 4 illustrates the package support of the package during a first intermediate processing step according to the disclosure.

FIG. 4 illustrates the package support of the package during a first intermediate processing step according to the disclosure; and FIG. 4 further illustrates the package support of the package during a second intermediate processing step according to the disclosure.

Figure 5:
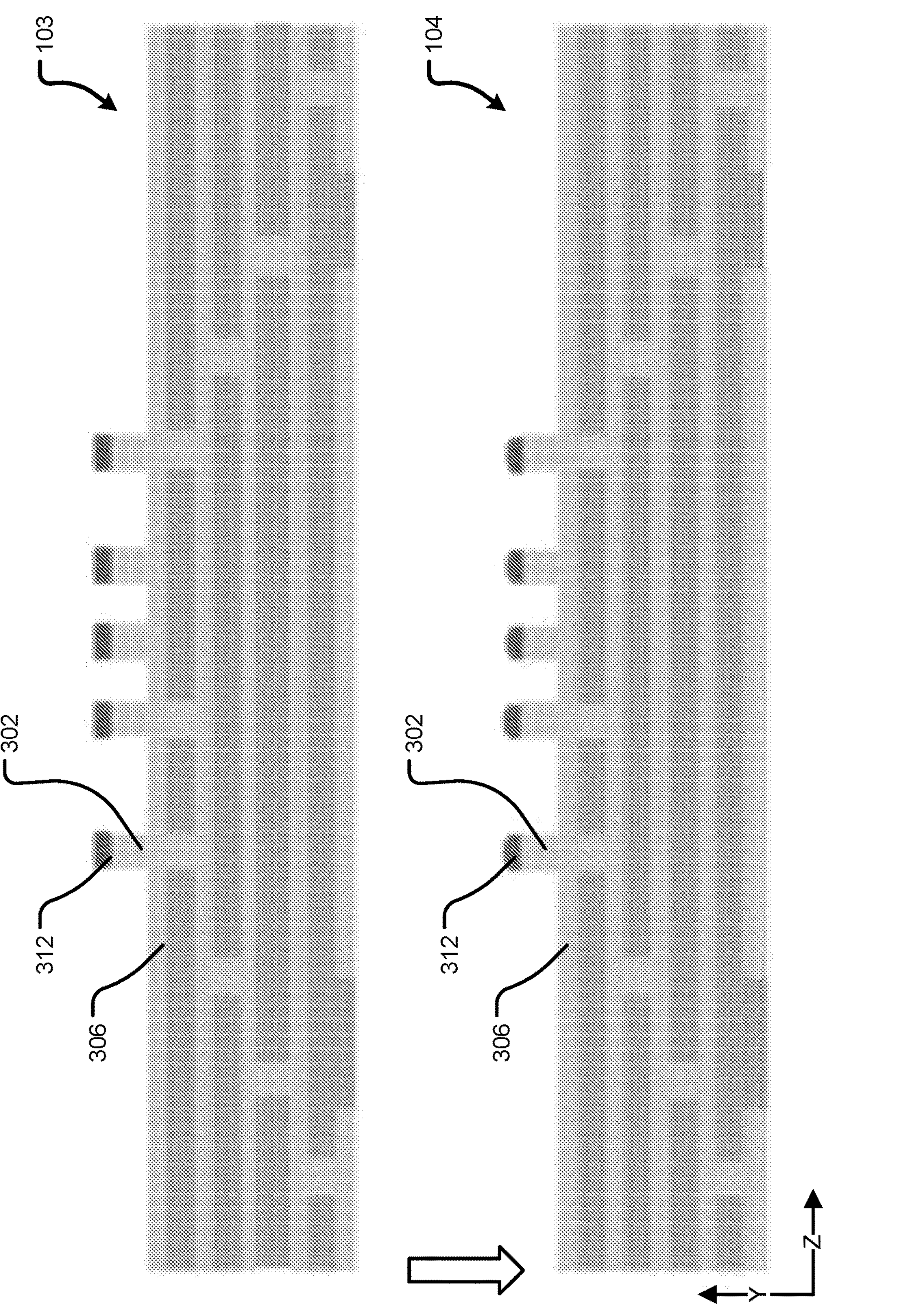
FIG. 5 illustrates the package support of the package during a third intermediate processing step according to the disclosure.

FIG. 5 illustrates the package support of the package during a third intermediate processing step according to the disclosure; and FIG. 5 further illustrates the package support of the package during a fourth intermediate processing step according to the disclosure.

Figure 6:
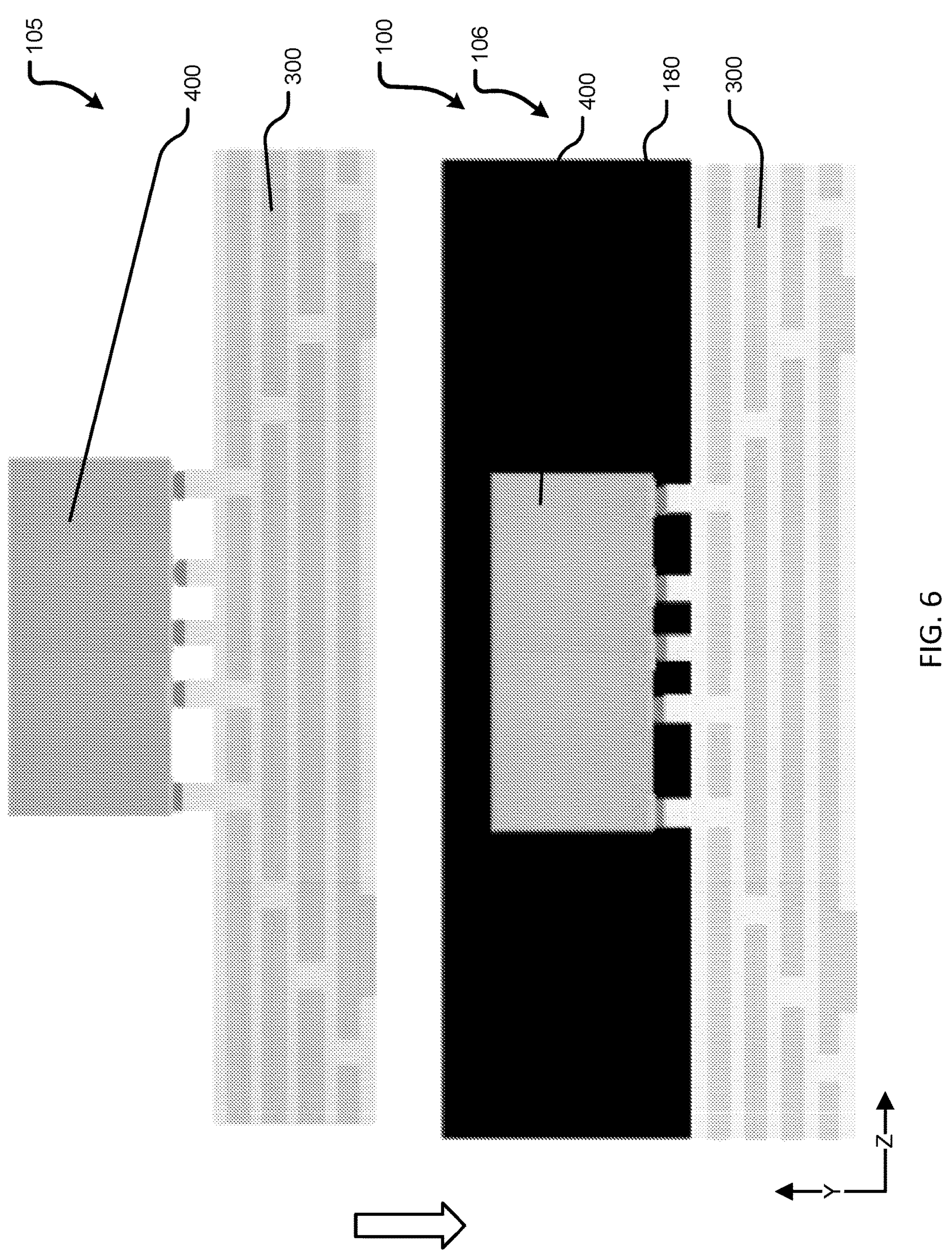
FIG. 6 illustrates the package support of the package during a fifth intermediate processing step according to the disclosure.

FIG. 6 illustrates the package support of the package during a fifth intermediate processing step according to the disclosure; and FIG. 6 further illustrates the package support of the package during a sixth intermediate processing step according to the disclosure.

The aspects of FIG. 4, FIG. 5, and FIG. 6 may include any one or more features as described herein. In particular, FIG. 4, FIG. 5, and FIG. 6 show an exemplary aspects of a package 100 that may include any one or more other features, components, arrangements, and the like as described herein.

In particular, FIG. 4 illustrates the package support 300 of the package 100 during a first intermediate processing step 101 according to the disclosure. In this regard, during the first intermediate processing step 101, the package support 300 may include an upper surface layer 304, a second surface layer 306, a vertical portion 314, and/or the like.

In aspects, the upper surface layer 304 may be a nonmetallic layer, a nonconductive layer, an insulating layer, and/or the like extending along the Z axis. Further, the upper surface layer 304 may extend along an axis perpendicular to the y-axis and the z-axis across a top surface of the package support 300.

In aspects, the second surface layer 306 may be a metallic layer, a conductive layer, and/or the like. Further, the second surface layer 306 may extend along an axis perpendicular to the y-axis and the z-axis across the package support 300 below the upper surface layer 304. In aspects, a surface of the upper surface layer 304 may be parallel to a surface of the second surface layer 306.

In aspects, the vertical portion 314 may be a metallic portion, a conductive portion, and/or the like. The vertical portion 314 may extend along the y-axis through the package support 300. Prior to the first intermediate processing step 101, the vertical portion 314 may not extend vertically above the upper surface layer 304. The vertical portion 314 may make electrical connection to the second surface layer 306 and/or other layers of the package support 300. In aspects, the vertical portion 314 may be the structure that subsequently results in the electrical connection portions 302.

In aspects, the package support 300 may be implemented as a laminated sandwich structure of one or more conductive layers including the second surface layer 306 and insulating layers including the upper surface layer 304. In aspects, the package support 300 may include plated-through holes that may include the vertical portion 314 that allow interconnections between layers of the package support 300 including the second surface layer 306 and/or other layers of the package support 300.

In aspects, the disclosed device and process may implement the first intermediate processing step 101. The first intermediate processing step 101 may include implementation of a PCB solder masking process for the package support 300. In this regard, the PCB solder masking process for the package support 300 may apply a mask to certain portions of an upper surface of the package support 300 including areas of the vertical portion 314 where no etching is desired. Further, the PCB solder masking process for the package support 300 implemented as part of the first intermediate processing step 101 may not be applied to areas desired for etching including areas of the upper surface layer 304 across an upper surface of the package support 300.

FIG. 4 further illustrates the package support 300 of the package 100 during a second intermediate processing step 102 according to the disclosure. In this regard, the disclosure includes the second intermediate processing step 102 that may include an etch process for the package support 300, a metal plate up process for the package support 300, an etch off process for the solder mask, and/or the like for the package support 300 to expose a formed metal pillar that is the electrical connection portions 302 of the package support 300. More specifically, the second intermediate processing step 102 may include an etch process for the package support 300 to etch portions of the package support 300 not protected by a mask associated with the first intermediate processing step 101. As a result of the etch process, the electrical connection portions 302 may be formed on the package support 300 extending up vertically and/or along the y-axis from the second surface layer 306.

Further, the package 100 to may include a metal plate up process for the package support 300 that may add further metal to the vertical portion 314 that may result in forming the electrical connection portions 302 as illustrated in the second intermediate processing step 102 of FIG. 4. Further, the package 100 to may include an etch off process for the solder mask, and/or the like for the package support 300 to remove the mask applied during the first intermediate processing step 101 to expose a formed metal pillar that is the electrical connection portions 302 of the package support 300.

FIG. 5 illustrates the package support 300 of the package 100 during a third intermediate processing step 103 according to the disclosure. In aspects, the third intermediate processing step 103 may implement a solder print on a top of the metal pillar that is the electrical connection portions 302 to form the solder connection 312. In particular, the electrical connection portions 302 formed as part of the first intermediate processing step 101 and the second intermediate processing step 102, may be subjected to a solder print on an upper surface of the electrical connection portions 302. The solder can be applied with a solder printing method, a screen printing method, a stencil method, a solder dip method, and/or the like onto the upper surface of the electrical connection portions 302. In aspects, the solder dip method may result in less material wastage.

FIG. 5 further illustrates the package support 300 of the package 100 during a fourth intermediate processing step 104 according to the disclosure. In aspects, the fourth intermediate processing step 104 may implement a reflow of a solder associated with the solder connection 312. Accordingly, the electrical connection portions 302 and the solder connection 312 of the package support 300 may now be prepared for connection to the at least one semiconductor device 400.

FIG. 6 illustrates the package support 300 of the package 100 during a fifth intermediate processing step 105 according to the disclosure. In aspects, the fifth intermediate processing step 105 may further implement a flip die and attach process for flipping the at least one semiconductor device 400 and attaching the at least one semiconductor device 400 to the package support 300. In this regard, the fifth intermediate processing step 105 may locate the package support 300 and the metal pillar implemented by the electrical connection portions 302 with the solder print that may subsequently form the solder connection 312 to a die bond pad that is the electrical contact pads 402 of the at least one semiconductor device 400.

FIG. 6 further illustrates the package support 300 of the package 100 during a sixth intermediate processing step 106 according to the disclosure. In aspects, the sixth intermediate processing step 106 may further implement a reflow process to reflow a solder of the solder connection 312 to form the connection between the electrical connection portions 302 of the package support 300 and the electrical contact pads 402 of the at least one semiconductor device 400.

Further, the sixth intermediate processing step 106 may include forming the over-mold 180 at least partially around the at least one semiconductor device 400 and on an upper surface of the package support 300. In aspects, the sixth intermediate processing step 106 may include a process of forming the over-mold 180 that may include injection molding, transfer molding, and/or compression molding around the at least one semiconductor device 400, and other components of the package 100 to provide protection from the outside environment. In aspects of the disclosure, the package 100 may be formed by implementing one or more of the first intermediate processing step 101, the second intermediate processing step 102, the third intermediate processing step 103, the fourth intermediate processing step 104, the fifth intermediate processing step 105, the sixth intermediate processing step 106, and/or the like. In aspects of the disclosure, the various processing steps may be implemented in order, may be implemented with a different order, some steps may be skipped, additional steps may be included, and/or the like.

Figure 7:
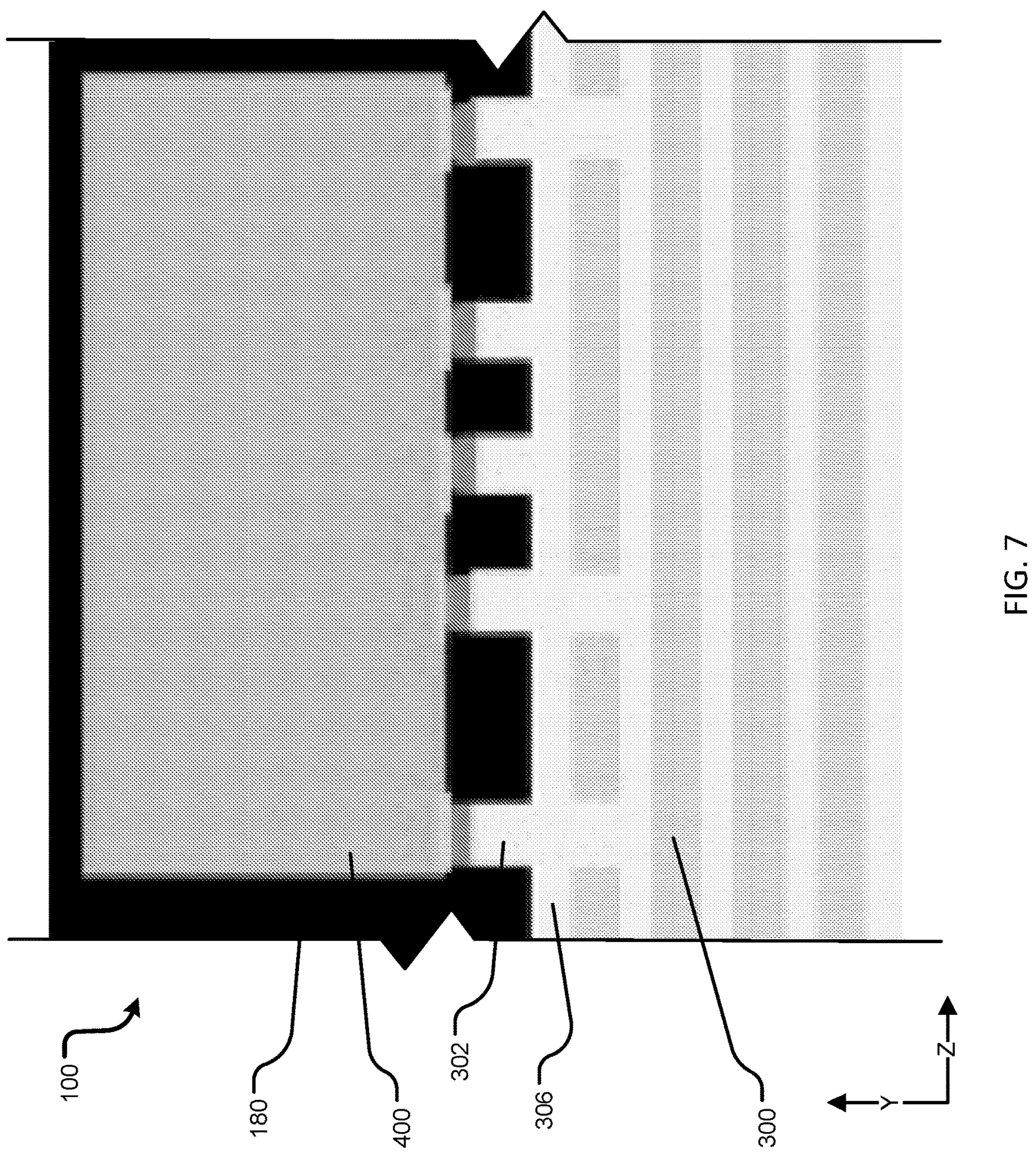
FIG. 7 illustrates a further cross-sectional view of the package according to FIG. 1.

FIG. 7 illustrates a further cross-sectional view of the package according to FIG. 1.

Figure 8:
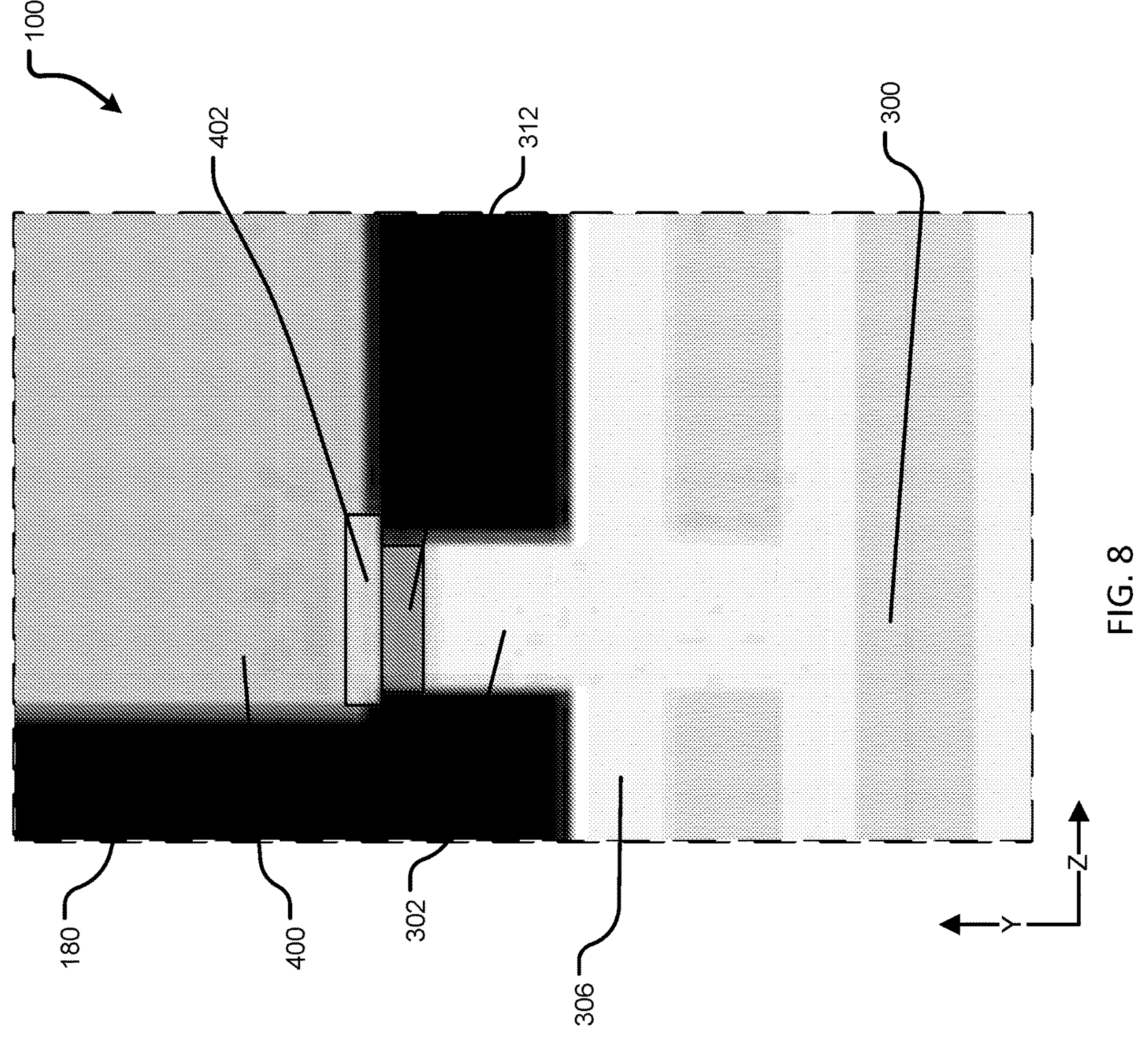
FIG. 8 illustrates yet a further cross-sectional view of the package according to FIG. 7.

FIG. 8 illustrates yet a further cross-sectional view of the package according to FIG. 7.

The aspects of FIG. 7 and FIG. 8 may include any one or more features as described herein. In particular, FIG. 7 and FIG. 8 show an exemplary implementation of a package 100 that may include any one or more other features, components, arrangements, and the like as described herein. In particular, FIG. 7 and FIG. 8 show details of the package 100 after implementation of the first intermediate processing step 101, the second intermediate processing step 102, the third intermediate processing step 103, the fourth intermediate processing step 104, the fifth intermediate processing step 105, the sixth intermediate processing step 106, and/or the like associated with FIG. 4, FIG. 5, and FIG. 6. In particular, FIG. 7 of FIG. 8 show the details of the package 100 including details and location of the at least one semiconductor device 400 and the package support 300 as well as details and location of the electrical contact pads 402, the solder connection 312, the electrical connection portions 302, the second surface layer 306, and/or the like.

Figure 9:
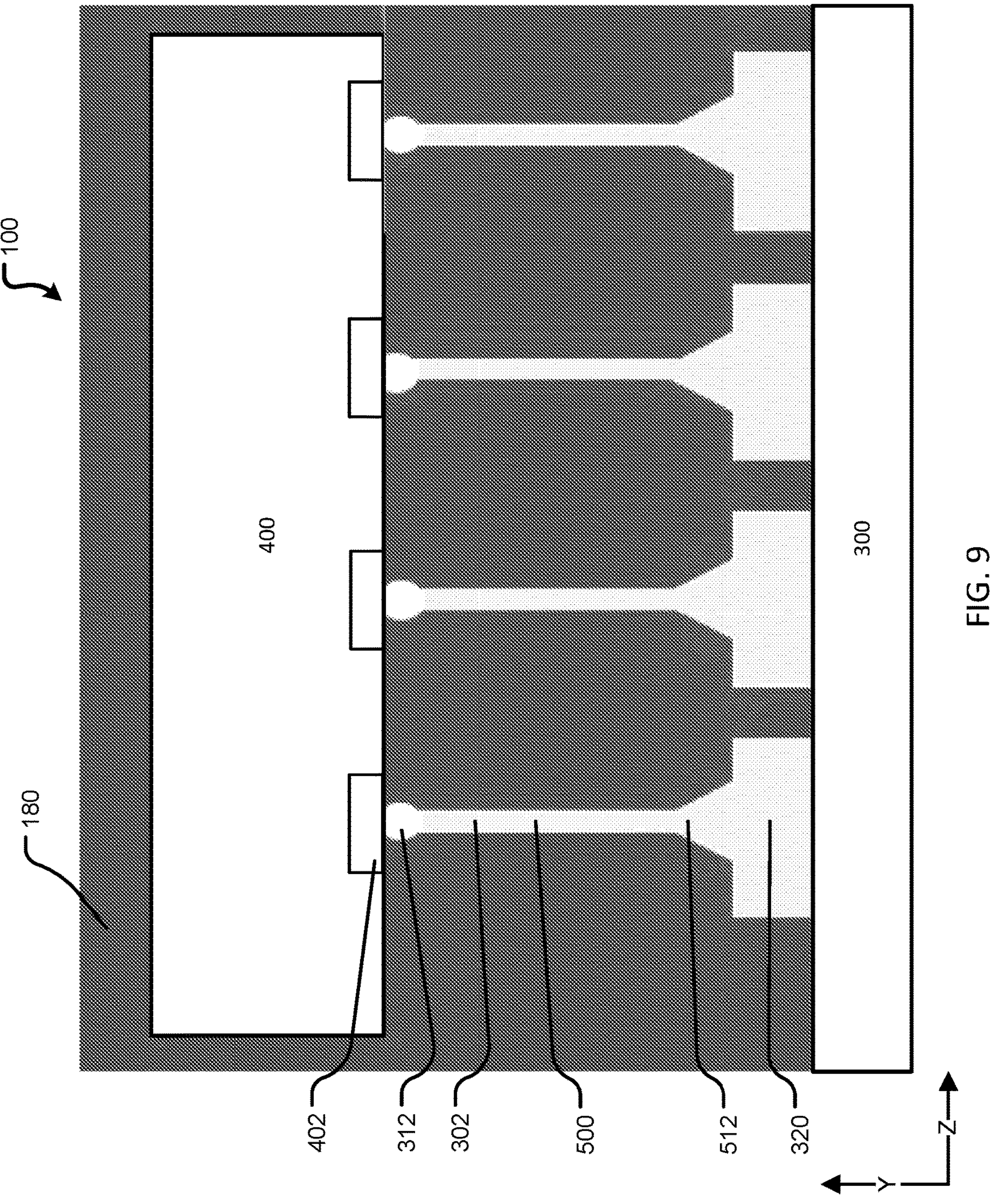
FIG. 9 illustrates a cross-sectional view of another aspect a package according to the disclosure.

FIG. 9 illustrates a cross-sectional view of another aspect a package according to the disclosure.

The aspects of FIG. 9 may include any one or more features as described herein. In particular, FIG. 9 shows an exemplary implementation of a package 100 that may include any one or more other features, components, arrangements, and the like as described herein. With reference to FIG. 9, the package 100 may include the at least one semiconductor device 400, the package support 300, the over-mold 180, and the electrical connection portions 302.

In aspects, the disclosed device and process may implement and/or may utilize a bond wire, such as a thicker copper (Cu) wire, to bond a vertical wire from a substrate pad. In aspects, the disclosed device and process may further apply a solder paste at a vertical wire tip. In aspects, the disclosed device and process may further implement a flip chip pad attach to the vertical wire tip and reflow the solder.

More specifically, in aspects, the package 100 may implement the electrical connection portions 302 as a bond wire device connection 500. The bond wire device connection 500 implementation of the electrical connection portions 302 may be implemented with a thicker metallic wire. In aspects, the bond wire device connection 500 implementation of the electrical connection portions 302 may be implemented with a thicker metallic wire. In aspects, the bond wire device connection 500 implementation of the electrical connection portions 302 may be implemented with a thicker metallic wire in comparison to typical device wire connections.

In aspects, the bond wire device connection 500 implementation of the electrical connection portions 302 may be implemented with a thicker copper (Cu) wire, thicker aluminum wire, thicker gold wire, and/or the like. In aspects, the bond wire device connection 500 implementation of the electrical connection portions 302 may be implemented with a thicker copper (Cu) wire, thicker aluminum wire, thicker gold wire, and/or the like in comparison to typical device wire connections.

In aspects, the bond wire device connection 500 implementation of the electrical connection portions 302 may extend along the y-axis from the package support 300 to the at least one semiconductor device 400. Further, the package support 300 may be configured with a bond pad 320. In aspects, the bond pad 320 may be electrically connected to various conductive layers of the package support 300, such as the second surface layer 306. In aspects, the bond pad 320 may be electrically connected to various conductive portions of the package support 300, such as the vertical portion 314. In aspects, the bond pad 320 may be formed of a metallic material such as nickel gold alloy (NiAu).

In aspects, the bond pad 320 may be arranged on upper surface of the package support 300 and the bond pad 320 may be configured to make electrical connection to the bond wire device connection 500 implementation of the electrical connection portions 302. In this regard, during a process of forming the bond wire device connection 500 implementation of the electrical connection portions 302, the material of the bond wire device connection 500 implementation of the electrical connection portions 302 may melt forming a connection 512 to the bond pad 320.

In aspects, the bond wire device connection 500 implementation of the electrical connection portions 302 may include the solder connection 312 arranged on a tip thereof as described herein. In particular, the solder connection 312 may be formed on the bond wire device connection 500 implementation of the electrical connection portions 302 as part of the third intermediate processing step 103 and the fourth intermediate processing step 104 described herein. In aspects, the bond wire device connection 500 may be implemented in other components of the package 100 including connections between the at least one semiconductor device 400 and the silicon carbide (SiC) integrated passive device (IPD) 600, the at least one semiconductor device 400 and other components of the package 100, the silicon carbide (SiC) integrated passive device (IPD) 600 and other components of the package 100, the package support 300 and other components of the package 100, and/or the like.

In aspects, a distance or pitch between implementations of the bond wire device connection 500 may be much less than prior art connections. Accordingly, more connections can be implemented per unit area of the package 100. The disclosed device and process may include numerous advantages that the metal to metal pitch can be closer, cost advantages due to shorter process, and/or the like.

Additionally, the aspect of the package 100 illustrated in FIG. 9 may include the over-mold 180 as described herein. In aspects, the aspect of the package 100 illustrated in FIG. 9 may be configured through implementation of one or more of the third intermediate processing step 103, the fourth intermediate processing step 104, the fifth intermediate processing step 105, the sixth intermediate processing step 106, and/or the like as described herein. In aspects, the bond wire device connection 500 may be attached to portions of the package 100 by an adhesive, a solder, sintering, eutectic bonding, ultrasonically welding, and/or the like. In aspects, the bond pad 320 may be attached to portions of the package 100 by an adhesive, a solder, sintering, eutectic bonding, ultrasonically welding, and/or the like.

Figure 10:
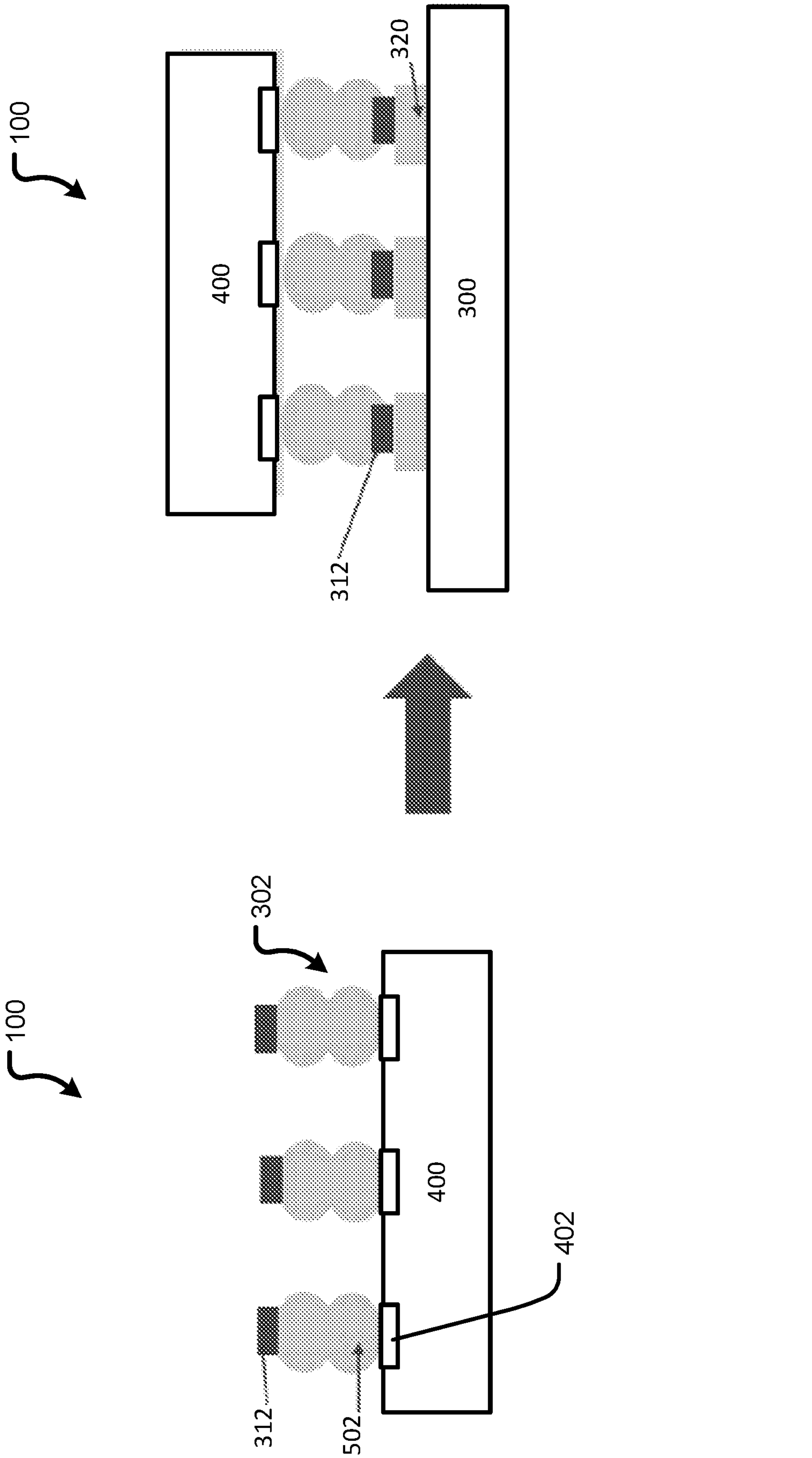
FIG. 10 illustrates a cross-sectional view of another aspect a package according to the disclosure.

FIG. 10 illustrates a cross-sectional view of another aspect a package according to the disclosure.

The aspects of FIG. 10 may include any one or more features as described herein. In particular, FIG. 10 show an exemplary implementation of a package 100 that may include any one or more other features, components, arrangements, and the like as described herein. With reference to FIG. 10, the package 100 may include the at least one semiconductor device 400, the package support 300, and the electrical connection portions 302.

In aspects, the disclosed device and process may create a bump ball, such as a copper bump ball, at a flip chip pad. In aspects, the disclosed device and process may further apply solder on a top of a top ball. In aspects, the disclosed device and process may further implement a flip chip process that may face down the chip thereon and attach to substrate paddle and reflow.

More specifically, in aspects, the package 100 may implement the electrical connection portions 302 as a bump ball connection 502. In aspects, the bump ball connection 502 may be implemented as a stud bump connection. In aspects, the bump ball connection 502 may be formed during a wire bonding process without a protruding wire. In aspects, the bump ball connection 502 may include copper, aluminum, gold, and/or the like. In aspects, the bump ball connection 502 may be formed using one or more of heat, pressure, and ultrasonic energy to form the bump ball connection 502 from an end of a wire. In aspects, the bump ball connection 502 implementation of the electrical connection portions 302 may be implemented with a metallic bump ball. In aspects, the bump ball connection 502 implementation of the electrical connection portions 302 may be implemented with a copper (Cu) bump ball.

In aspects, the bump ball connection 502 implementation of the electrical connection portions 302 may be implemented with a plurality of metallic bump balls. In aspects, the bump ball connection 502 implementation of the electrical connection portions 302 may be implemented with a plurality of copper (Cu) bump balls.

In aspects, the bump ball connection 502 implementation of the electrical connection portions 302 may extend along the y-axis from the package support 300 to the at least one semiconductor device 400. Further, the package support 300 may be configured with a bond pad 320. In aspects, the bond pad 320 may be electrically connected to various conductive layers of the package support 300, such as the second surface layer 306. In aspects, the bond pad 320 may be electrically connected to various conductive portions of the package support 300, such as the vertical portion 314. In aspects, the bond pad 320 may be formed of a metallic material such as nickel gold alloy (NiAu).

In aspects, the bond pad 320 may be arranged on upper surface of the package support 300 and the bond pad 320 may be configured to make electrical connection to the bump ball connection 502 implementation of the electrical connection portions 302.

In aspects, the bump ball connection 502 implementation of the electrical connection portions 302 may include the solder connection 312 arranged on a top surface thereof as described herein. In particular, the solder connection 312 may be formed on the topmost one of the bump ball connection 502 implementation of the electrical connection portions 302 as part of the third intermediate processing step 103 and the fourth intermediate processing step 104 described herein.

In aspects, a distance or pitch between implementations of the bump ball connection 502 may be much less than prior art connections. Accordingly, more connections can be implemented per unit area of the package 100. The disclosed device and process may include numerous advantages that the metal to metal pitch can be closer, cost advantages due to shorter process, and/or the like. In aspects, the bump ball connection 502 may be implemented in other components of the package 100 including connections between the at least one semiconductor device 400 and the silicon carbide (SiC) integrated passive device (IPD) 600, the at least one semiconductor device 400 and other components of the package 100, the silicon carbide (SiC) integrated passive device (IPD) 600 and other components of the package 100, the package support 300 and other components of the package 100, and/or the like.

Additionally, the aspect of the package 100 illustrated in FIG. 10 may include the over-mold 180 (not shown) as described herein. In aspects, the aspect of the package 100 illustrated in FIG. 10 may be configured through implementation of one or more of the third intermediate processing step 103, the fourth intermediate processing step 104, the fifth intermediate processing step 105, the sixth intermediate processing step 106, and/or the like as described herein. In aspects, the bump ball connection 502 may be attached to portions of the package 100 by an adhesive, a solder, sintering, eutectic bonding, ultrasonically welding, and/or the like.

Figure 11:
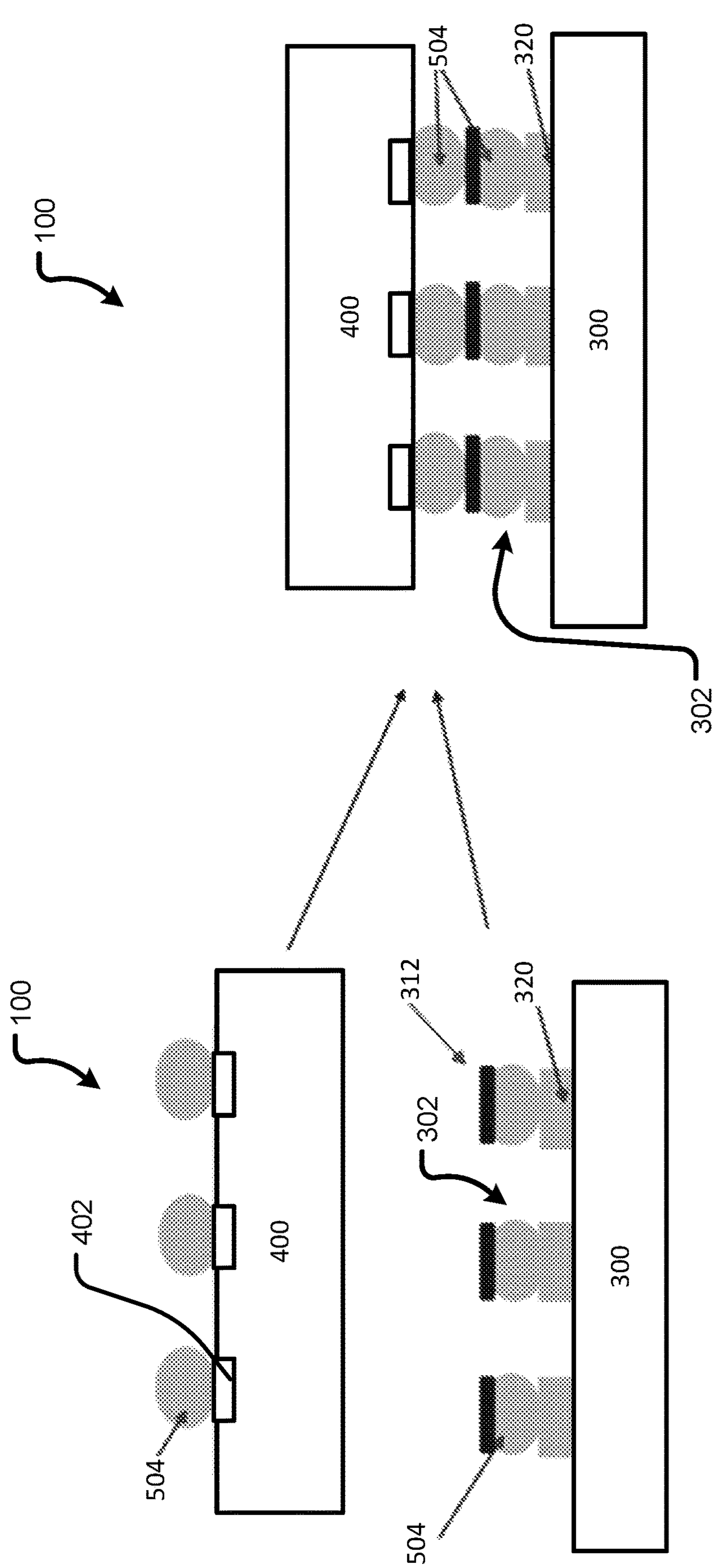
FIG. 11 illustrates a cross-sectional view of another aspect a package according to the disclosure.

FIG. 11 illustrates a cross-sectional view of another aspect a package according to the disclosure.

The aspects of FIG. 11 may include any one or more features as described herein. In particular, FIG. 11 show an exemplary implementation of a package 100 that may include any one or more other features, components, arrangements, and the like as described herein. With reference to FIG. 11, the package 100 may include the at least one semiconductor device 400, the package support 300, and the electrical connection portions 302.

In aspects, the disclosed device and process may create a stud bump, such as a gold (Au) stud bump at a flip chip and a substrate paddle respectively. Both of the stud bumps may be attached with an application pressure process.

More specifically, in aspects, the package 100 may implement the electrical connection portions 302 as a stud bump connection 504. In aspects, the stud bump connection 504 may be implemented as a bump ball connection.

In aspects, the stud bump connection 504 may be formed during a wire bonding process without a protruding wire. In aspects, the stud bump connection 504 may include copper, aluminum, gold, and/or the like. In aspects, the stud bump connection 504 may be formed using one or more of heat, pressure, and ultrasonic energy to form the stud bump connection 504 from an end of a wire. In aspects, the stud bump connection 504 implementation of the electrical connection portions 302 may be implemented with a metallic stud bump. In aspects, the stud bump connection 504 implementation of the electrical connection portions 302 may be implemented with a gold (Au) stud bump.

In aspects, the stud bump connection 504 implementation of the electrical connection portions 302 may be implemented with a metallic stud bump arranged on the electrical contact pads 402 of the at least one semiconductor device 400. In aspects, the stud bump connection 504 implementation of the electrical connection portions 302 may be implemented with a metallic stud bump arranged on the bond pad 320 of the package support 300. In aspects, the stud bump connection 504 implementation of the electrical connection portions 302 may be implemented with a metallic stud bump arranged on the electrical contact pads 402 of the at least one semiconductor device 400; and the stud bump connection 504 implementation of the electrical connection portions 302 may be implemented with a metallic stud bump arranged on the bond pad 320 of the package support 300. In aspects, the stud bump connection 504 implementation of the electrical connection portions 302 may attach to the package support 300 and/or the at least one semiconductor device 400 with application pressure.

In aspects, the stud bump connection 504 implementation of the electrical connection portions 302 may be implemented with a plurality of gold (Au) stud bumps. In aspects, the stud bump connection 504 implementation of the electrical connection portions 302 may be implemented with a plurality of gold (Au) stud bumps.

In aspects, the stud bump connection 504 implementation of the electrical connection portions 302 may extend along the y-axis from the package support 300 to the at least one semiconductor device 400. Further, the package support 300 may be configured with a bond pad 320. In aspects, the bond pad 320 may be electrically connected to various conductive layers of the package support 300, such as the second surface layer 306. In aspects, the bond pad 320 may be electrically connected to various conductive portions of the package support 300, such as the vertical portion 314. In aspects, the bond pad 320 may be formed of a metallic material such as nickel gold alloy (NiAu).

In aspects, the bond pad 320 may be arranged on upper surface of the package support 300 and the bond pad 320 may be configured to make electrical connection to the stud bump connection 504 implementation of the electrical connection portions 302. In aspects, the stud bump connection 504 implementation of the electrical connection portions 302 may include the solder connection 312 arranged on a top surface thereof as described herein. In particular, the solder connection 312 may be formed on the top of one of the stud bump connection 504 implementation of the electrical connection portions 302 as part of the third intermediate processing step 103 and the fourth intermediate processing step 104 described herein.

Accordingly, the disclosed device and process illustrated in FIG. 11 may create a stud bump, such as a gold (Au) stud bump implemented by the stud bump connection 504 at a flip chip implementation of the at least one semiconductor device 400 and a substrate paddle implementation of the package support 300 respectively. Both of the stud bumps may be attached with an application pressure process. In aspects, the stud bump connection 504 may be implemented in other components of the package 100 including connections between the at least one semiconductor device 400 and the silicon carbide (SiC) integrated passive device (IPD) 600, the at least one semiconductor device 400 and other components of the package 100, the silicon carbide (SiC) integrated passive device (IPD) 600 and other components of the package 100, the package support 300 and other components of the package 100, and/or the like.

In aspects, a distance or pitch between implementations of the stud bump connection 504 may be much less than prior art connections. Accordingly, more connections can be implemented per unit area of the package 100. The disclosed device and process may include numerous advantages that the metal to metal pitch can be closer, cost advantages due to shorter process, and/or the like.

Additionally, the aspect of the package 100 illustrated in FIG. 11 may include the over-mold 180 (not shown) as described herein. In aspects, the aspect of the package 100 illustrated in FIG. 11 may be configured through implementation of one or more of the third intermediate processing step 103, the fourth intermediate processing step 104, the fifth intermediate processing step 105, the sixth intermediate processing step 106, and/or the like as described herein. In aspects, the stud bump connection 504 may be attached to portions of the package 100 by an adhesive, a solder, sintering, eutectic bonding, ultrasonically welding, and/or the like.

Figure 12:
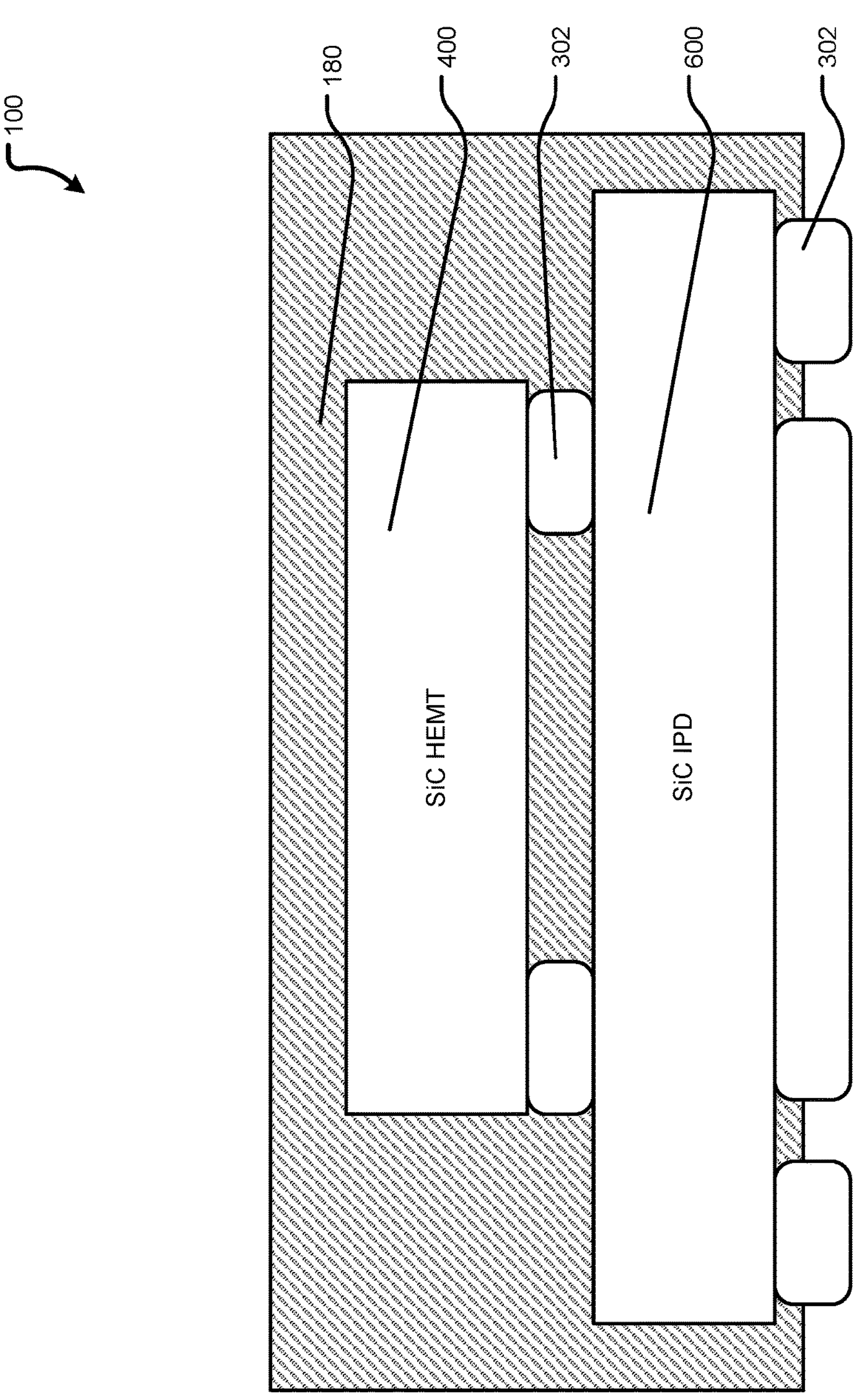
FIG. 12 illustrates a cross-sectional view of another aspect a package according to the disclosure.

FIG. 12 illustrates a cross-sectional view of another aspect a package according to the disclosure.

The aspects of FIG. 12 may include any one or more features as described herein. In particular, FIG. 12 show an exemplary implementation of a package 100 that may include any one or more other features, components, arrangements, and the like as described herein. With reference to FIG. 12, the package 100 may include the at least one semiconductor device 400 and the electrical connection portions 302.

Additionally, the package 100 implemented in FIG. 12 further includes the silicon carbide (SiC) integrated passive device (IPD) 600. In this regard, the silicon carbide (SiC) integrated passive device (IPD) 600 may be arranged between the at least one semiconductor device 400 and any other components of the package 100. Further, the package 100 may include various implementations of the electrical connection portions 302 as described herein between the at least one semiconductor device 400 and the silicon carbide (SiC) integrated passive device (IPD) 600. Moreover, the package 100 may include various implementations of the electrical connection portions 302 as described herein between the silicon carbide (SiC) integrated passive device (IPD) 600 and any other components of the package 100. In this regard, the electrical connection portions 302 may include one or more of the electrical connection portions 302 extending from the package support 300, the electrical connection portions 302 configured as a bond wire device connection 500, the electrical connection portions 302 configured as a bump ball connection 502, and/or the electrical connection portions 302 configured as a stud bump connection 504.

In aspects, a distance or pitch between implementations of the electrical connection portions 302 may be much less than prior art connections. Accordingly, more connections can be implemented per unit area of the package 100. The disclosed device and process may include numerous advantages that the metal to metal pitch can be closer, cost advantages due to shorter process, and/or the like.

Additionally, the aspect of the package 100 illustrated in FIG. 12 may include the over-mold 180 as described herein, which may also extend around the silicon carbide (SiC) integrated passive device (IPD) 600. In aspects, the aspect of the package 100 illustrated in FIG. 12 may be configured through implementation of one or more of the third intermediate processing step 103, the fourth intermediate processing step 104, the fifth intermediate processing step 105, the sixth intermediate processing step 106, and/or the like as described herein. In aspects, the electrical connection portions 302 may be attached to portions of the package 100 by an adhesive, a solder, sintering, eutectic bonding, ultrasonically welding, and/or the like.

Figure 13:
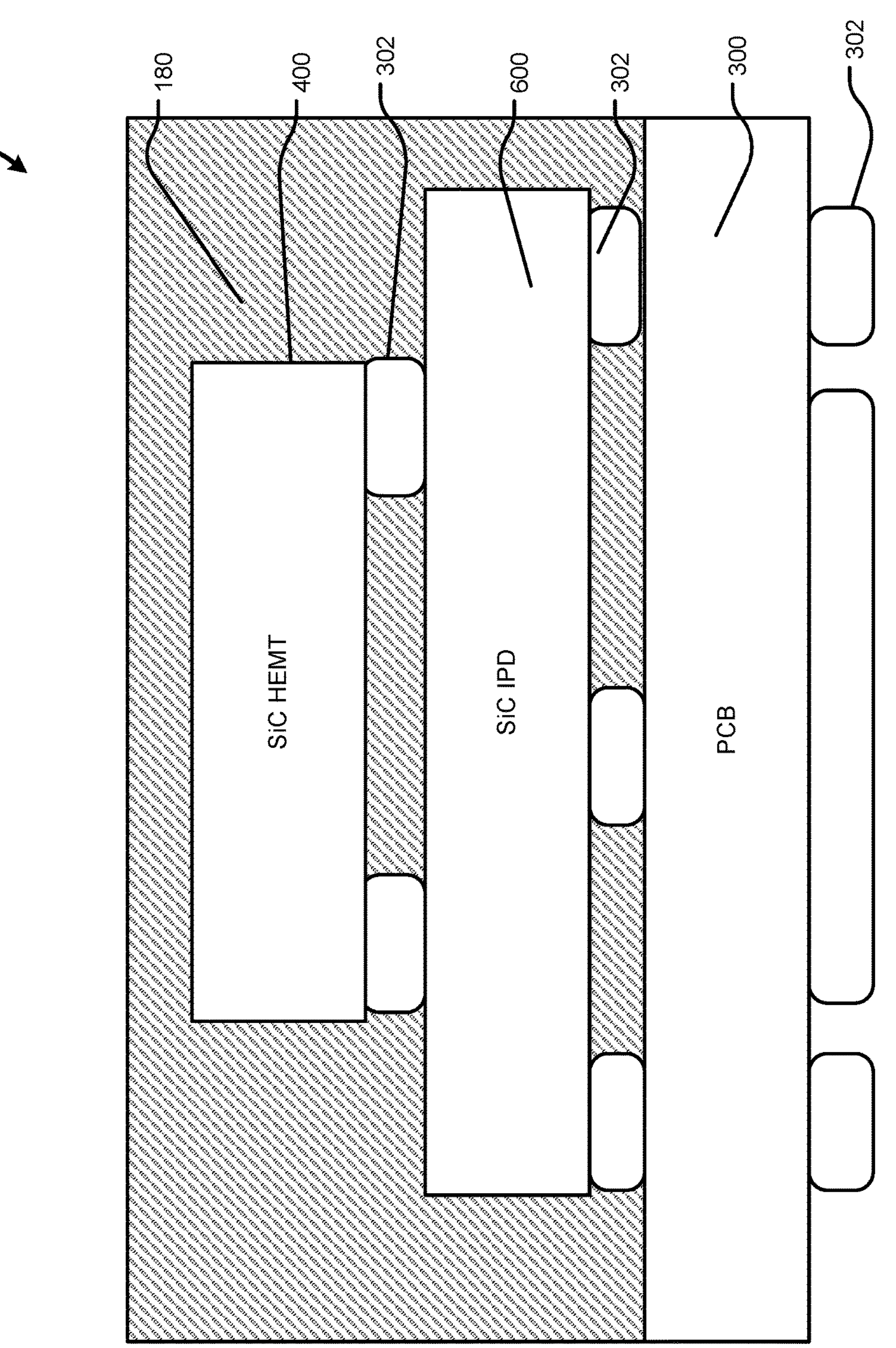
FIG. 13 illustrates a cross-sectional view of another aspect a package according to the disclosure.

FIG. 13 illustrates a cross-sectional view of another aspect a package according to the disclosure.

The aspects of FIG. 13 may include any one or more features as described herein. In particular, FIG. 13 show an exemplary implementation of a package 100 that may include any one or more other features, components, arrangements, and the like as described herein. With reference to FIG. 13, the package 100 may include the at least one semiconductor device 400, the package support 300, and the electrical connection portions 302.

Additionally, the package 100 implemented in FIG. 13 further includes the silicon carbide (SiC) integrated passive device (IPD) 600. In this regard, the silicon carbide (SiC) integrated passive device (IPD) 600 may be arranged between the at least one semiconductor device 400 and the package support 300. Further, the package 100 may include various implementations of the electrical connection portions 302 as described herein between the at least one semiconductor device 400 and the silicon carbide (SiC) integrated passive device (IPD) 600. Moreover, the package 100 may include various implementations of the electrical connection portions 302 as described herein between the silicon carbide (SiC) integrated passive device (IPD) 600 and the package support 300. Furthermore, the package 100 may include various implementations of the electrical connection portions 302 as described herein between the package support 300 and any other components of the package 100. In this regard, the electrical connection portions 302 may include one or more of the electrical connection portions 302 extending from the package support 300, the electrical connection portions 302 configured as a bond wire device connection 500, the electrical connection portions 302 configured as a bump ball connection 502, and/or the electrical connection portions 302 configured as a stud bump connection 504.

In aspects, a distance or pitch between implementations of the electrical connection portions 302 may be much less than prior art connections. Accordingly, more connections can be implemented per unit area of the package 100. The disclosed device and process may include numerous advantages that the metal to metal pitch can be closer, cost advantages due to shorter process, and/or the like.

Additionally, the aspect of the package 100 illustrated in FIG. 13 may include the over-mold 180 as described herein, which may also extend around the silicon carbide (SiC) integrated passive device (IPD) 600. In aspects, the aspect of the package 100 illustrated in FIG. 13 may be configured through implementation of one or more of the third intermediate processing step 103, the fourth intermediate processing step 104, the fifth intermediate processing step 105, the sixth intermediate processing step 106, and/or the like as described herein. In aspects, the electrical connection portions 302 may be attached to portions of the package 100 by an adhesive, a solder, sintering, eutectic bonding, ultrasonically welding, and/or the like.

Figure 14:
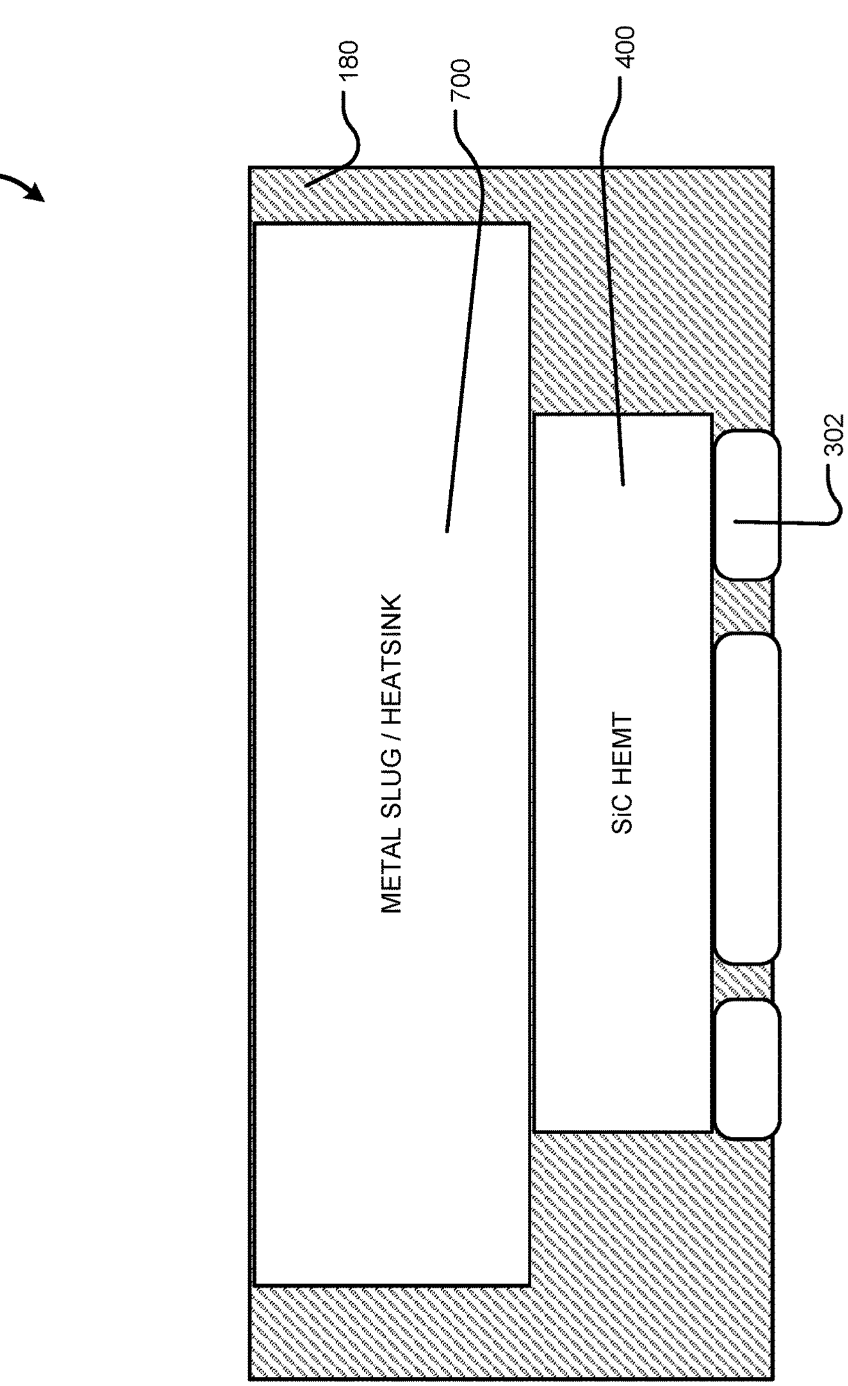
FIG. 14 illustrates a cross-sectional view of another aspect a package according to the disclosure.

FIG. 14 illustrates a cross-sectional view of another aspect a package according to the disclosure.

The aspects of FIG. 14 may include any one or more features as described herein. In particular, FIG. 14 show an exemplary implementation of a package 100 that may include any one or more other features, components, arrangements, and the like as described herein. With reference to FIG. 14, the package 100 may include the at least one semiconductor device 400 and the electrical connection portions 302. Further, the package 100 may include a heat sink 700.

Further, the package 100 may include various implementations of the electrical connection portions 302 as described herein between the at least one semiconductor device 400 and any other components of the package 100. In this regard, the electrical connection portions 302 may include one or more of the electrical connection portions 302 extending from the package support 300, the electrical connection portions 302 configured as a bond wire device connection 500, the electrical connection portions 302 configured as a bump ball connection 502, and/or the electrical connection portions 302 configured as a stud bump connection 504.

In aspects, a distance or pitch between implementations of the electrical connection portions 302 may be much less than prior art connections. Accordingly, more connections can be implemented per unit area of the package 100. The disclosed device and process may include numerous advantages that the metal to metal pitch can be closer, cost advantages due to shorter process, and/or the like.

Additionally, the aspect of the package 100 illustrated in FIG. 14 may include the over-mold 180 as described herein, which may also extend around the heat sink 700. In aspects, the aspect of the package 100 illustrated in FIG. 14 may be configured through implementation of one or more of the third intermediate processing step 103, the fourth intermediate processing step 104, the fifth intermediate processing step 105, the sixth intermediate processing step 106, and/or the like as described herein. In aspects, the electrical connection portions 302 may be attached to portions of the package 100 by an adhesive, a solder, sintering, eutectic bonding, ultrasonically welding, and/or the like.

The heat sink 700 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The heat sink 700 may include an insulating material, a dielectric material, and/or the like.

Figure 15:
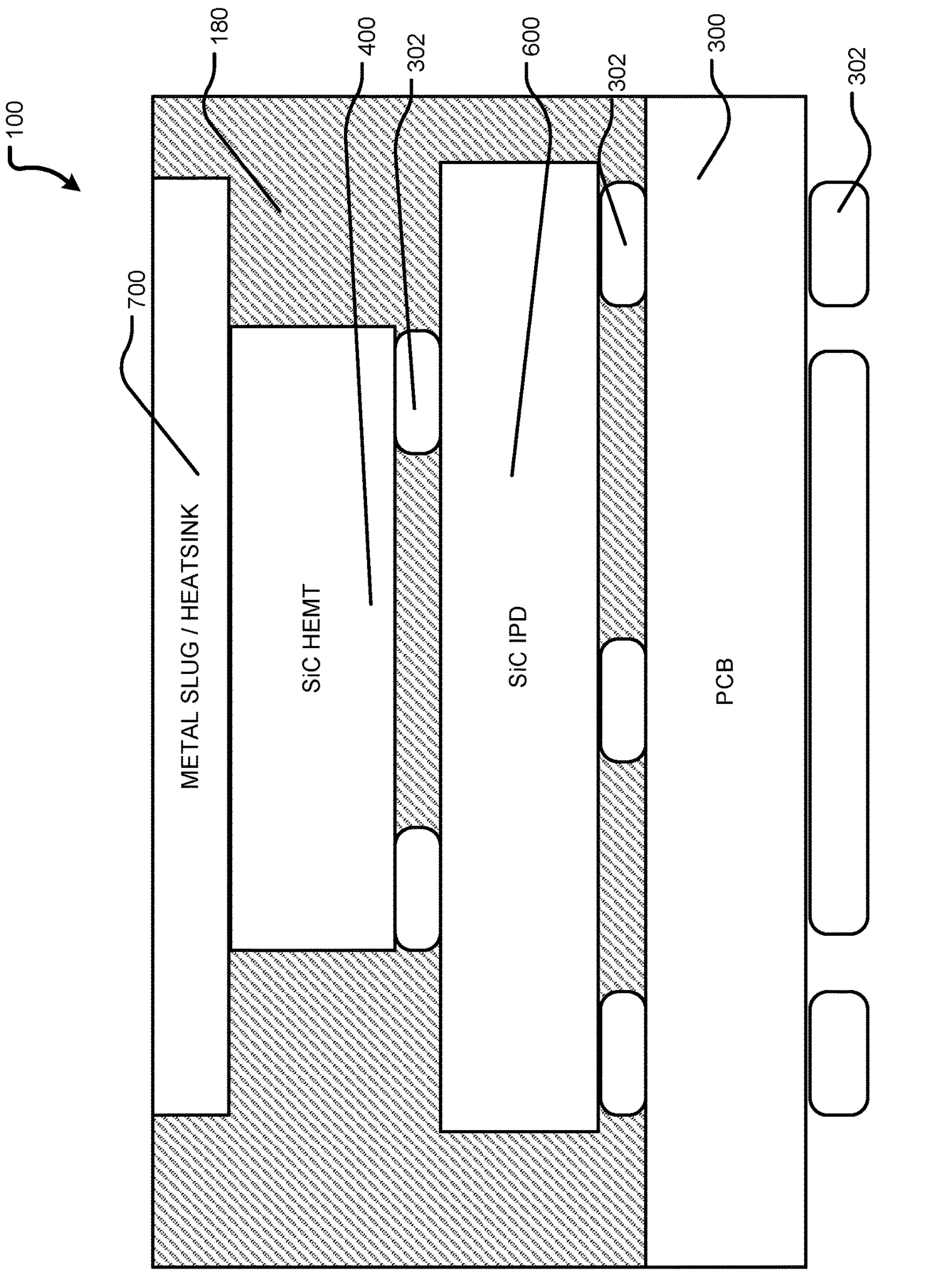
FIG. 15 illustrates a cross-sectional view of another aspect a package according to the disclosure.

FIG. 15 illustrates a cross-sectional view of another aspect a package according to the disclosure.

The aspects of FIG. 15 may include any one or more features as described herein. In particular, FIG. 15 show an exemplary implementation of a package 100 that may include any one or more other features, components, arrangements, and the like as described herein. With reference to FIG. 15, the package 100 may include the at least one semiconductor device 400 and the electrical connection portions 302. Additionally, the package 100 may include the package support 300. Further, the package 100 may include the heat sink 700.

Additionally, the package 100 implemented in FIG. 15 further includes the silicon carbide (SiC) integrated passive device (IPD) 600. In this regard, the silicon carbide (SiC) integrated passive device (IPD) 600 may be arranged between the at least one semiconductor device 400 and the package support 300. Further, the package 100 may include various implementations of the electrical connection portions 302 as described herein between the at least one semiconductor device 400 and the silicon carbide (SiC) integrated passive device (IPD) 600. Moreover, the package 100 may include various implementations of the electrical connection portions 302 as described herein between the silicon carbide (SiC) integrated passive device (IPD) 600 and the package support 300. Furthermore, the package 100 may include various implementations of the electrical connection portions 302 as described herein between the package support 300 and any other components of the package 100. In this regard, the electrical connection portions 302 may include one or more of the electrical connection portions 302 extending from the package support 300, the electrical connection portions 302 configured as a bond wire device connection 500, the electrical connection portions 302 configured as a bump ball connection 502, and/or the electrical connection portions 302 configured as a stud bump connection 504.

In aspects, a distance or pitch between implementations of the electrical connection portions 302 may be much less than prior art connections. Accordingly, more connections can be implemented per unit area of the package 100. The disclosed device and process may include numerous advantages that the metal to metal pitch can be closer, cost advantages due to shorter process, and/or the like.

Additionally, the aspect of the package 100 illustrated in FIG. 15 may include the over-mold 180 as described herein, which may also extend around the silicon carbide (SiC) integrated passive device (IPD) 600 and at least partially around the heat sink 700. In aspects, the aspect of the package 100 illustrated in FIG. 15 may be configured through implementation of one or more of the third intermediate processing step 103, the fourth intermediate processing step 104, the fifth intermediate processing step 105, the sixth intermediate processing step 106, and/or the like as described herein. In aspects, the electrical connection portions 302 may be attached to portions of the package 100 by an adhesive, a solder, sintering, eutectic bonding, ultrasonically welding, and/or the like.

Figure 16:
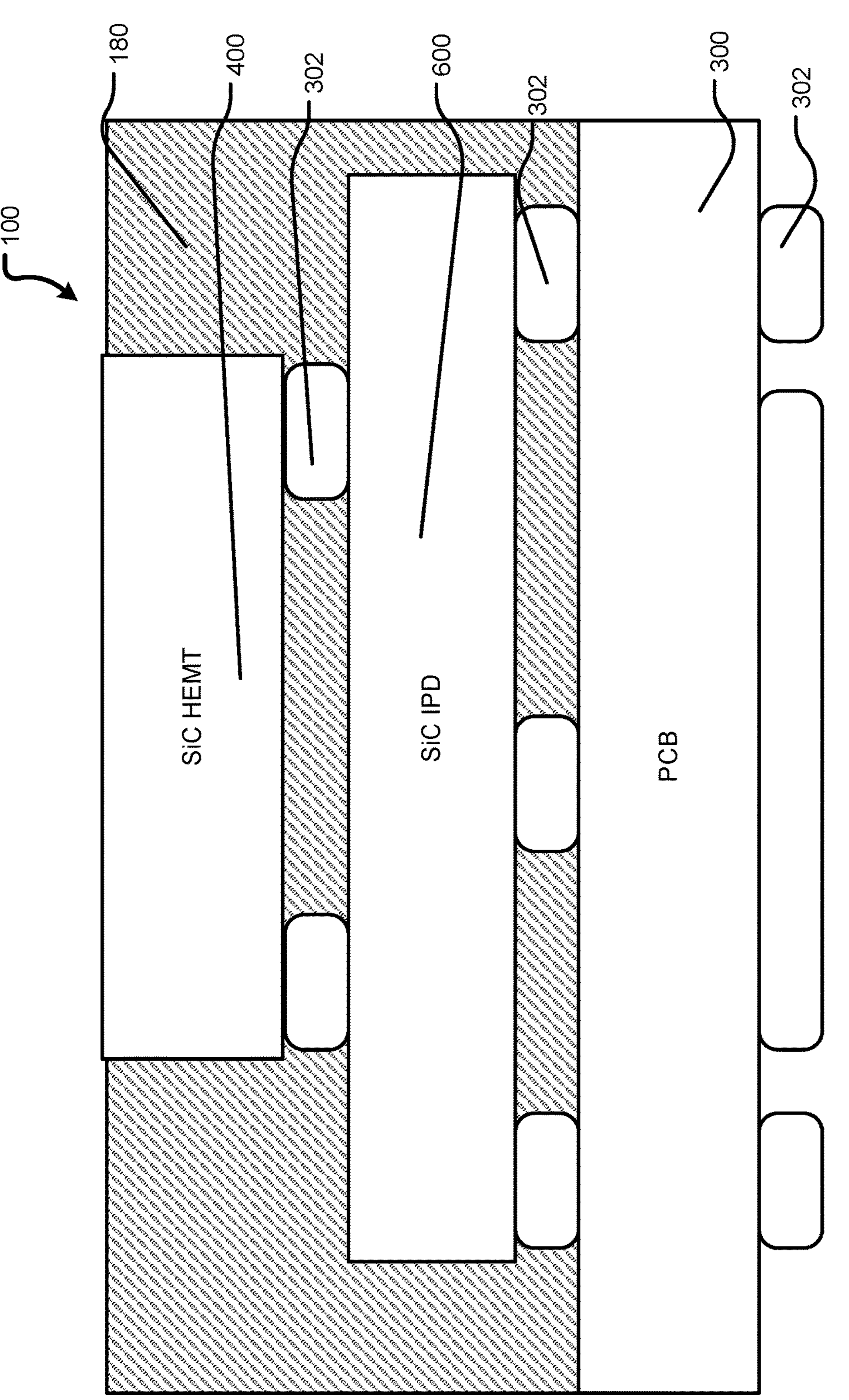
FIG. 16 illustrates a cross-sectional view of another aspect a package according to the disclosure.

FIG. 16 illustrates a cross-sectional view of another aspect a package according to the disclosure.

The aspects of FIG. 16 may include any one or more features as described herein. In particular, FIG. 16 show an exemplary implementation of a package 100 that may include any one or more other features, components, arrangements, and the like as described herein. With reference to FIG. 16, the package 100 may include the at least one semiconductor device 400 and the electrical connection portions 302. Additionally, the package 100 may include the package support 300.

Additionally, the package 100 implemented in FIG. 16 further includes the. In this regard, the silicon carbide (SiC) integrated passive device (IPD) 600 may be arranged between the at least one semiconductor device 400 and the package support 300. Further, the package 100 may include various implementations of the electrical connection portions 302 as described herein between the at least one semiconductor device 400 and the silicon carbide (SiC) integrated passive device (IPD) 600. Moreover, the package 100 may include various implementations of the electrical connection portions 302 as described herein between the silicon carbide (SiC) integrated passive device (IPD) 600 and the package support 300. Furthermore, the package 100 may include various implementations of the electrical connection portions 302 as described herein between the package support 300 and any other components of the package 100. In this regard, the electrical connection portions 302 may include one or more of the electrical connection portions 302 extending from the package support 300, the electrical connection portions 302 configured as a bond wire device connection 500, the electrical connection portions 302 configured as a bump ball connection 502, and/or the electrical connection portions 302 configured as a stud bump connection 504.

In aspects, a distance or pitch between implementations of the electrical connection portions 302 may be much less than prior art connections. Accordingly, more connections can be implemented per unit area of the package 100. The disclosed device and process may include numerous advantages that the metal to metal pitch can be closer, cost advantages due to shorter process, and/or the like.

Figure 18:
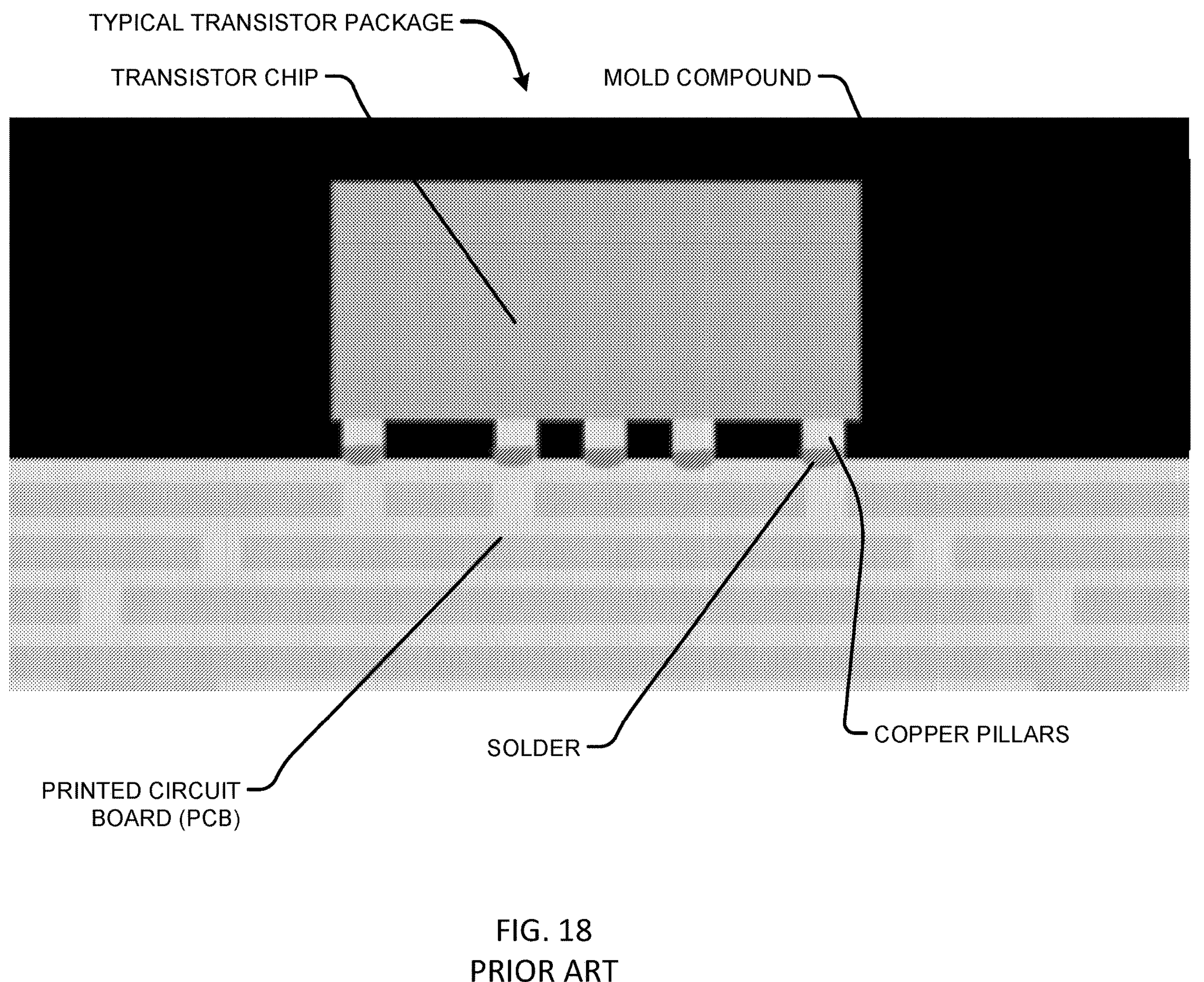
FIG. 18 illustrates a typical transistor package.
Figure 19:
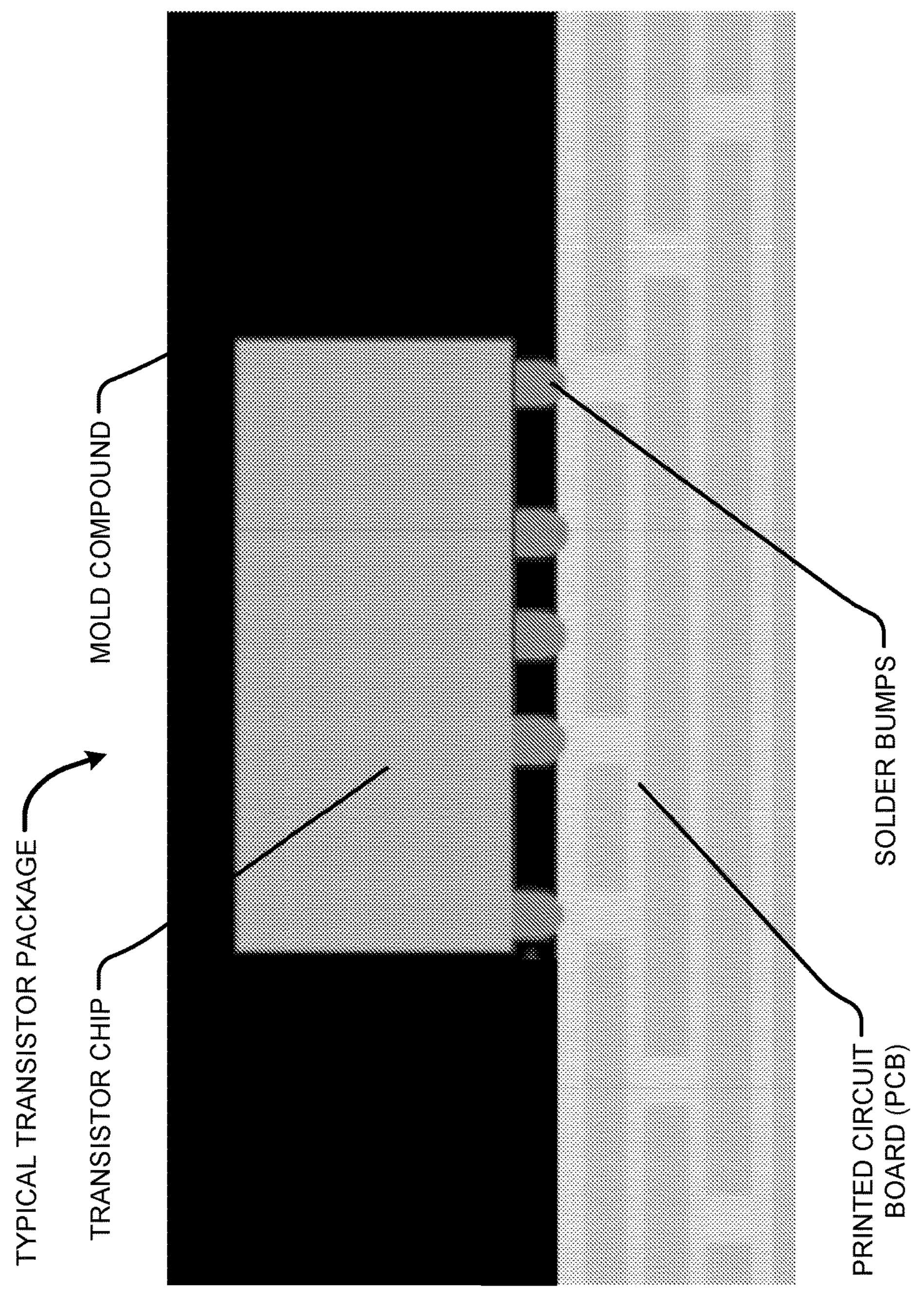
FIG. 19 illustrates another implementation of a typical transistor package.
Figure 20:
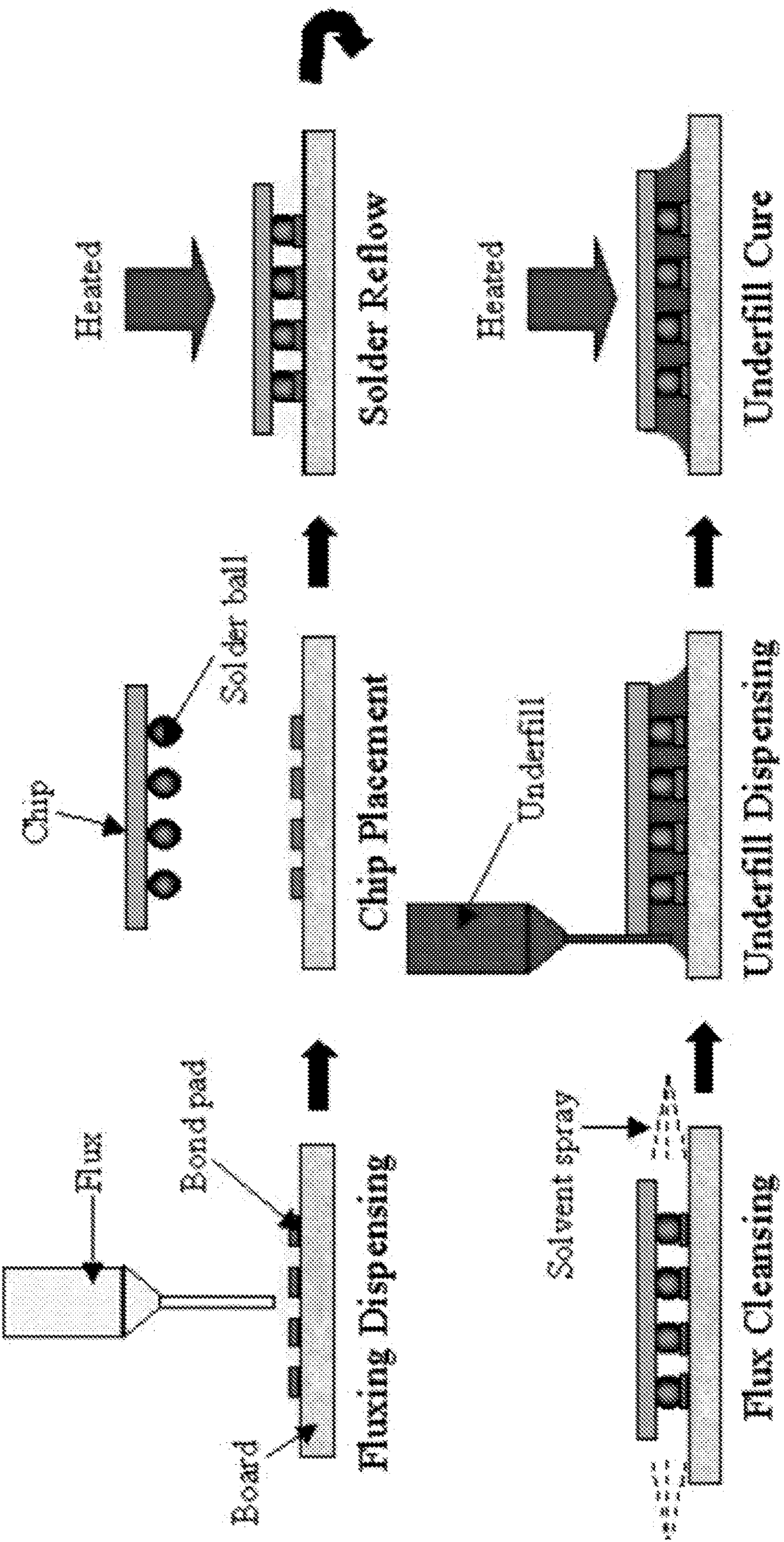
FIG. 20 illustrates a typical manufacturing process.

Additionally, the aspect of the package 100 illustrated in FIG. 18 may include the over-mold 180 which may not extend to a top of the at least one semiconductor device 400. In aspects, the aspect of the package 100 illustrated in FIG. 16 may be configured through implementation of one or more of the third intermediate processing step 103, the fourth intermediate processing step 104, the fifth intermediate processing step 105, the sixth intermediate processing step 106, and/or the like as described herein. In aspects, the electrical connection portions 302 may be attached to portions of the package 100 by an adhesive, a solder, sintering, eutectic bonding, ultrasonically welding, and/or the like.

In particular exemplary aspects of the disclosure, the disclosure may be implemented as a package 100 comprising: at least one semiconductor device 400; a package support 300 configured to support the at least one semiconductor device 400; electrical connection portions 302 comprising at least one of the following: electrical connection portions 302 extending from the package support 300, electrical connection portions 302 configured as a bond wire device connection 500, electrical connection portions 302 configured as a bump ball connection 502, and/or electrical connection portions 302 configured as a stud bump connection 504, wherein the electrical connection portions 302 connect between the at least one semiconductor device 400 and the package support 300. The package 100 wherein the at least one semiconductor device 400 is configured as a flip chip; the package 100 wherein the electrical connection portions 302 comprise a solder connection 312 arranged on a tip thereof; the package 100 wherein the electrical connection portions 302 comprise a solder connection 312 solder printed a tip thereof; the package 100 wherein the solder connection 312 is configured with solder printing; the package 100 wherein the solder connection 312 is configured with solder arranged to implement a solder reflow; the package 100 wherein the at least one semiconductor device 400 comprises a gallium nitride (GaN) silicon carbide (SiC) transistor; the package 100 wherein the package support 300 comprises a printed circuit board (PCB), a printed wiring board (PWB), and/or a printed circuit board assembly (PCBA); the package 100 wherein the electrical connection portions 302 comprises a vertical portion 314 that extends through the package support 300; the package 100 wherein the electrical connection portions 302 comprises a vertical portion 314 implemented by a plated-through hole that extends through the package support 300; the package 100 wherein the electrical connection portions 302 comprises an etched portion of the package support 300; the package 100 wherein the electrical connection portions 302 are configured as a bond wire device connection 500 connected to a bond pad 320 on the package support 300; the package 100 wherein the bond wire device connection 500 comprises the solder connection 312 arranged on a tip thereof; the package 100 wherein the electrical connection portions 302 comprise the bump ball connection 502; the package 100 wherein the bump ball connection 502 is configured with a plurality of metallic bump balls; the package 100 wherein the bump ball connection 502 comprises a solder connection 312 arranged on a top surface thereof the package 100 wherein the electrical connection portions 302 comprise the stud bump connection 504; the package 100 wherein the stud bump connection 504 is arranged on electrical contact pads 402 of the at least one semiconductor device 400 and on bond pads 320 of the package support 300; the package 100 further comprising an over-mold 180 configured to at least partially surround the at least one semiconductor device 400; and the package 100 further comprising a silicon carbide (SiC) integrated passive device (IPD) 600, wherein the electrical connection portions 302 arranged between the at least one semiconductor device 400 and the silicon carbide (SiC) integrated passive device (IPD) 600.

Figure 17:
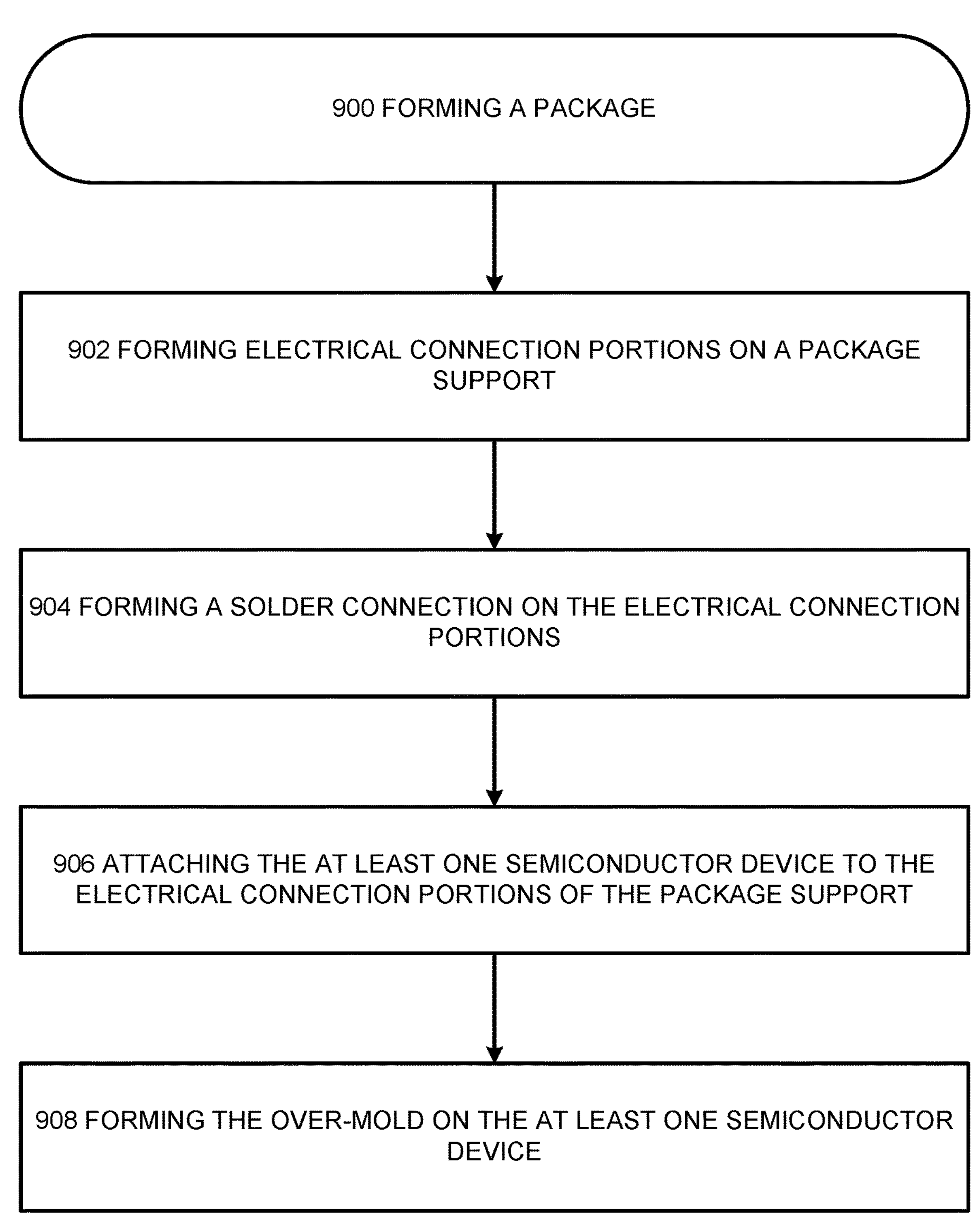
FIG. 17 illustrates a process of forming a package according to the disclosure.

FIG. 17 illustrates a process of forming a package according to the disclosure.

FIG. 17 may include any one or more other features, components, arrangements, and the like as described herein. In particular, FIG. 17 illustrates a process of forming a package 900 that relates to forming the package 100 as described herein. It should be noted that the aspects of the forming a package 900 may be performed in a different order consistent with the aspects described herein. Additionally, it should be noted that portions of the forming a package 900 may be performed in a different order consistent with the aspects described herein. Moreover, the forming a package 900 may be modified to have more or fewer processes consistent with the various aspects disclosed herein.

The forming a package 900 may include the forming electrical connection portions on a package support 902. The forming electrical connection portions on a package support 902 may relate to forming the electrical connection portions 302 on the package support 300 as described herein.

In particular aspects, the forming electrical connection portions on a package support 902 may implement the first intermediate processing step 101. The first intermediate processing step 101 may include implementation of a PCB solder masking process for the package support 300. In this regard, the PCB solder masking process for the package support 300 may apply a mask to certain portions of an upper surface of the package support 300 including areas of the vertical portion 314 where no etching is desired. Further, the PCB solder masking process for the package support 300 implemented as part of the first intermediate processing step 101 may not be applied to areas desired for etching including areas of the upper surface layer 304 across an upper surface of the package support 300.

In particular aspects, the forming electrical connection portions on a package support 902 includes the second intermediate processing step 102 that may include an etch process for the package support 300, a metal plate up process for the package support 300, an etch off process for the solder mask, and/or the like for the package support 300 to expose a formed metal pillar that is the electrical connection portions 302 of the package support 300. More specifically, the second intermediate processing step 102 may include an etch process for the package support 300 to etch portions of the package support 300 not protected by a mask associated with the first intermediate processing step 101. As a result of the etch process, the electrical connection portions 302 may be formed on the package support 300 extending up vertically and/or along the y-axis from the second surface layer 306.

The forming a package 900 may include the forming a solder connection on the electrical connection portions 904. The forming a solder connection on the electrical connection portions 904 may relate to forming the solder connection 312 on the electrical connection portions 302 as described herein.

In particular aspects, the forming a solder connection on the electrical connection portions 904 may include the third intermediate processing step 103 according to the disclosure. In aspects, the third intermediate processing step 103 may implement a solder print on a top of the metal pillar that is the electrical connection portions 302 to form the solder connection 312. In particular, the electrical connection portions 302 formed as part of the first intermediate processing step 101 and the second intermediate processing step 102, may be subjected to a solder print on an upper surface of the electrical connection portions 302. The solder can be applied with a solder printing method, a screen printing method, a stencil method, and/or the like onto the upper surface of the electrical connection portions 302.

In particular aspects, the forming a solder connection on the electrical connection portions 904 may include the fourth intermediate processing step 104 according to the disclosure. In aspects, the fourth intermediate processing step 104 may implement a reflow of a solder associated with the solder connection 312. Accordingly, the electrical connection portions 302 and the solder connection 312 of the package support 300 may now be prepared for connection to the at least one semiconductor device 400.

The forming a package 900 may include the attaching the at least one semiconductor device to the electrical connection portions of the package support 906. The attaching the at least one semiconductor device to the electrical connection portions of the package support 906 may relate to attaching the at least one semiconductor device 400 to the electrical connection portions 302 of the package support 300 as described herein.

In particular aspects, the attaching the at least one semiconductor device to the electrical connection portions of the package support 906 may include the fifth intermediate processing step 105 according to the disclosure. In aspects, the fifth intermediate processing step 105 may further implement a flip die and attach process for flipping the at least one semiconductor device 400 and attaching the at least one semiconductor device 400 to the package support 300. In this regard, the fifth intermediate processing step 105 may locate the package support 300 and the metal pillar implemented by the electrical connection portions 302 with the solder print that may subsequently form the solder connection 312 to a die bond pad that is the electrical contact pads 402 of the at least one semiconductor device 400.

In aspects, the sixth intermediate processing step 106 may further implement a reflow process to reflow a solder of the solder connection 312 to form the connection between the electrical connection portions 302 of the package support 300 and the electrical contact pads 402 of the at least one semiconductor device 400.

The forming a package 900 may include the forming the over-mold on the at least one semiconductor device 908. The forming the over-mold on the at least one semiconductor device 908 may relate to forming the over-mold 180 on the at least one semiconductor device 400 as described herein.

In particular, the forming the over-mold on the at least one semiconductor device 908 may include forming the over-mold 180 at least partially around the at least one semiconductor device 400 and on an upper surface of the package support 300. In aspects, the sixth intermediate processing step 106 may include a process of forming the over-mold 180 that may include injection molding, transfer molding, and/or compression molding around the at least one semiconductor device 400, and other components of the package 100 to provide protection from the outside environment.

The package 100 may be implemented as an RF package and the at least one semiconductor device 400 may be implemented as a radio frequency device that may include, connect, support, or the like a transmitter, transmitter functions, a receiver, receiver functions, a transceiver, transceiver functions, matching network functions, harmonic termination circuitry, integrated passive devices (IPD), and the like. The at least one semiconductor device 400 may be implemented as a radio frequency device may be configured to, may support, or the like transmitting a radio wave and modulating that wave to carry data with allowable transmitter power output, harmonics, and/or band edge requirements. The at least one semiconductor device 400 device may be configured to, may support, or the like receiving a radio wave and demodulating the radio wave. The at least one semiconductor device 400 implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

In aspects, the package support 300 may be implemented as a PCB having a single-sided construction with one copper layer. In aspects, the package support 300 may be implemented as a PCB having a double-sided construction having two copper layers on both sides of one substrate layer. In aspects, the package support 300 may be implemented as a PCB having a multi-layer construction having outer and inner layers of copper, alternating with layers of a substrate. In aspects, the package support 300 may be implemented with a surface having a coating that protects the copper from corrosion and reduces the chances of solder shorts between traces or undesired electrical contact with stray bare wires. In aspects, the package support 300 may be implemented with a FR-4 glass epoxy, a cotton paper impregnated with phenolic resin, and/or the like. In aspects, the package support 300 may be implemented with FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester).

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a conductive mass of material by heat and/or pressure. The sintering process may operate without melting the material to the point of liquefaction. The sintering process may include sintering of metallic nano or hybrid powders in pastes or epoxies. The sintering process may include sintering in a vacuum. The sintering process may include sintering with the use of a protective gas.

The eutectic bonding of the disclosure may utilize a eutectic soldering process that may form a eutectic system. The eutectic system may be used between surfaces to be connected. The eutectic bonding may utilize metals that may be alloys and/or intermetallics that transition from solid to liquid state, or from liquid to solid state, at a specific composition and temperature. The eutectic alloys may be deposited by sputtering, evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

The package 100 may be implemented in any number of different applications. In this regard, the package 100 may be implemented in applications implementing high video bandwidth power amplifier transistors, a single path radio frequency power transistor, a single stage radio frequency power transistor, a multipath radio frequency power transistor, a Doherty configuration a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The package 100 may be implemented as a power package. The package 100 may be implemented as a power package and may implement applications and components as described herein.

The package 100 may be implemented as a radio frequency package. The package 100 may be implemented as a radio frequency package and may implement applications and components as described herein. The package 100 implemented as a radio frequency package may include, connect, support, or the like a transmitter, transmitter functions, a receiver, receiver functions, a transceiver, transceiver functions, and the like. The package 100 implemented as a radio frequency package may be configured to, may support, or the like transmitting a radio wave and modulating that wave to carry data with allowable transmitter power output, harmonics, and/or band edge requirements. The package 100 implemented as a radio frequency package may be configured to, may support, or the like receiving a radio wave and demodulating the radio wave. The package 100 implemented as a radio frequency package may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

The following are a number of nonlimiting EXAMPLES of aspects of the disclosure.

One EXAMPLE includes: a package that includes at least one semiconductor device. The package in addition includes a package support configured to support the at least one semiconductor device. The package moreover includes electrical connection portions having at least one of the following: electrical connection portions extending from the package support, electrical connection portions configured as a bond wire device connection, electrical connection portions configured as a bump ball connection, and/or electrical connection portions configured as a stud bump connection. The package also includes where the electrical connection portions connect between the at least one semiconductor device and the package support.

The above-noted EXAMPLE may further include any one or a combination of more than one of the following EXAMPLES: The package of the above-noted EXAMPLE where the at least one semiconductor device is configured as a flip chip. The package of the above-noted EXAMPLE where the electrical connection portions may include a solder connection arranged on a tip thereof. The package of the above-noted EXAMPLE where the solder connection is configured with solder printing. The package of the above-noted EXAMPLE where the solder connection is configured with solder arranged to implement a solder reflow. The package of the above-noted EXAMPLE where the at least one semiconductor device may include a gallium nitride (GaN) silicon carbide (SiC) transistor. The package of the above-noted EXAMPLE where the package support may include a printed circuit board (PCB), a printed wiring board (PWB), and/or a printed circuit board assembly (PCBA). The package of the above-noted EXAMPLE where the electrical connection portions may include a vertical portion that extends through the package support. The package of the above-noted EXAMPLE where the electrical connection portions may include a vertical portion implemented by a plated-through hole that extends through the package support. The package of the above-noted EXAMPLE where the electrical connection portions may include an etched portion of the package support. The package of the above-noted EXAMPLE where the electrical connection portions are configured as a bond wire device connection connected to a bond pad on the package support. The package of the above-noted EXAMPLE where the bond wire device connection may include a solder connection arranged on a tip thereof. The package of the above-noted EXAMPLE where the electrical connection portions may include the bump ball connection. The package of the above-noted EXAMPLE where the bump ball connection is configured with a plurality of metallic bump balls. The package of the above-noted EXAMPLE where the bump ball connection may include a solder connection arranged on a top surface thereof. The package of the above-noted EXAMPLE where the electrical connection portions may include the stud bump connection. The package of the above-noted EXAMPLE where the stud bump connection is arranged on electrical contact pads of the at least one semiconductor device and on bond pads of the package support. The package of the above-noted EXAMPLE may include an over-mold configured to at least partially surround the at least one semiconductor device. The package of the above-noted EXAMPLE may include a silicon carbide (SiC) integrated passive device (IPD), where the electrical connection portions are further arranged between the at least one semiconductor device and the silicon carbide (SiC) integrated passive device (IPD).

One EXAMPLE includes: a process that includes providing at least one semiconductor device. The process in addition includes configuring a package support to support the at least one semiconductor device. The process moreover includes configuring electrical connection portions having at least one of the following: electrical connection portions extending from the package support, electrical connection portions configured as a bond wire device connection, electrical connection portions configured as a bump ball connection, and/or electrical connection portions configured as a stud bump connection. The process also includes where the electrical connection portions connect between the at least one semiconductor device and the package support.

The above-noted EXAMPLE may further include any one or a combination of more than one of the following EXAMPLES: The process of the above-noted EXAMPLE where the at least one semiconductor device is configured as a flip chip. The process of the above-noted EXAMPLE where the electrical connection portions may include a solder connection arranged on a tip thereof. The process of the above-noted EXAMPLE where the solder connection is configured with solder printing. The process of the above-noted EXAMPLE where the solder connection is configured with solder arranged to implement a solder reflow. The process of the above-noted EXAMPLE where the at least one semiconductor device may include a gallium nitride (GaN) silicon carbide (SiC) transistor. The process of the above-noted EXAMPLE where the package support may include a printed circuit board (PCB), a printed wiring board (PWB), and/or a printed circuit board assembly (PCBA). The process of the above-noted EXAMPLE where the electrical connection portions may include a vertical portion that extends through the package support. The process of the above-noted EXAMPLE where the electrical connection portions may include a vertical portion implemented by a plated-through hole that extends through the package support. The process of the above-noted EXAMPLE where the electrical connection portions may include an etched portion of the package support. The process of the above-noted EXAMPLE where the electrical connection portions are configured as a bond wire device connection connected to a bond pad on the package support. The process of the above-noted EXAMPLE where the bond wire device connection may include a solder connection arranged on a tip thereof. The process of the above-noted EXAMPLE where the electrical connection portions may include the bump ball connection. The process of the above-noted EXAMPLE where the bump ball connection is configured with a plurality of metallic bump balls. The process of the above-noted EXAMPLE where the bump ball connection may include a solder connection arranged on a top surface thereof. The process of the above-noted EXAMPLE where the electrical connection portions may include the stud bump connection. The process of the above-noted EXAMPLE where the stud bump connection is arranged on electrical contact pads of the at least one semiconductor device and on bond pads of the package support. The process of the above-noted EXAMPLE may include an over-mold configured to at least partially surround the at least one semiconductor device. The process of the above-noted EXAMPLE may include a silicon carbide (SiC) integrated passive device (IPD), where the electrical connection portions are further arranged between the at least one semiconductor device and the silicon carbide (SiC) integrated passive device (IPD).

Accordingly, the disclosure set forth a transistor package implementing electrical connections that utilize a less costly manufacturing process, a shorter manufacturing process, and/or the like. Moreover, the disclosure set forth a transistor package implementing electrical connections that utilize a smaller size, greater arrangement flexibility, and/or the like.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A package comprising:
- at least one semiconductor device;
- a package support configured to support the at least one semiconductor device;
- a silicon carbide (SiC) integrated passive device (IPD); and
- electrical connection portions comprising at least one of the following: electrical connection portions extending from the package support, electrical connection portions configured as a bond wire device connection, electrical connection portions configured as a bump ball connection, and/or electrical connection portions configured as a stud bump connection,
- wherein the electrical connection portions connect between the at least one semiconductor device and the package support; and
- wherein the silicon carbide (SiC) integrated passive device (IPD) is between the package support and the at least one semiconductor device.

2. The package according to claim 1 further comprising a heat sink on the at least one semiconductor device,
- wherein the at least one semiconductor device is configured as a flip chip.

3. The package according to claim 1 wherein the electrical connection portions extend from the package support; and wherein the electrical connection portions comprise a solder connection arranged on a tip thereof.

4. The package according to claim 3 wherein the solder connection is configured with a plated solder portion; and wherein the electrical connection portions are further between the at least one semiconductor device and the silicon carbide (SiC) integrated passive device (IPD).

5. The package according to claim 3 wherein the solder connection is configured with solder printing; and wherein the electrical connection portions are further between the at least one semiconductor device and the silicon carbide (SiC) integrated passive device (IPD).

6. The package according to claim 3 wherein the solder connection is configured with solder arranged to implement a solder reflow; and wherein the electrical connection portions are further between the at least one semiconductor device and the silicon carbide (SiC) integrated passive device (IPD).

7. The package according to claim 1 further comprising a heat sink on the at least one semiconductor device, wherein the at least one semiconductor device comprises a gallium nitride (GaN) silicon carbide (SiC) transistor.

8. The package according to claim 1 wherein the package support comprises a printed circuit board (PCB), a printed wiring board (PWB), and/or a printed circuit board assembly (PCBA); wherein the electrical connection portions extend from the package support; and wherein the electrical connection portions are further between the at least one semiconductor device and the silicon carbide (SiC) integrated passive device (IPD).

9. The package according to claim 1 wherein the electrical connection portions comprise a vertical portion that extends through the package support.

10. The package according to claim 1 wherein the electrical connection portions comprise a vertical portion implemented by a plated-through hole that extends through the package support.

11. The package according to claim 1 wherein the electrical connection portions comprise an etched portion of the package support.

12. The package according to claim 1 wherein the electrical connection portions are configured as a bond wire device connection connected to a bond pad on the package support.

13. The package according to claim 12 wherein the bond wire device connection comprises a solder connection arranged on a tip thereof.

14. The package according to claim 1 wherein the electrical connection portions extend from the package support: wherein the electrical connection portions comprise the bump ball connection; and wherein the electrical connection portions are further between the at least one semiconductor device and the silicon carbide (SiC) integrated passive device (IPD).

15. The package according to claim 14 wherein the bump ball connection is configured with a plurality of metallic bump balls.

16. The package according to claim 14 wherein the bump ball connection comprises a solder connection arranged on a top surface thereof.

17. The package according to claim 1 wherein the electrical connection portions extend from the package support; wherein the electrical connection portions are further between the at least one semiconductor device and the silicon carbide (SiC) integrated passive device (IPD); and wherein the electrical connection portions comprise the stud bump connection.

18. The package according to claim 17 wherein the stud bump connection is arranged on electrical contact pads of the at least one semiconductor device and on bond pads of the package support.

19. The package according to claim 1 further comprising:

a heat sink; and an over-mold configured to at least partially surround the at least one semiconductor device.

20. The package according to claim 1 further comprising a heat sink, wherein the electrical connection portions are further arranged between the at least one semiconductor device and the silicon carbide (SiC) integrated passive device (IPD).

21. The package according to claim 1 further wherein the electrical connection portions are further arranged between the at least one semiconductor device and other components.

22. The package according to claim 1 wherein the electrical connection portions are further arranged between the package support and other components.

23. The package according to claim 1 wherein the electrical connection portions are further arranged between the at least one semiconductor device and other components.

24. A package comprising:

at least one semiconductor device;

a package support configured to support the at least one semiconductor device;

a silicon carbide (SiC) integrated passive device (IPD);

a heat sink on the at least one semiconductor device; and electrical connection portions configured and/or operable to connect between the at least one semiconductor device and the package support; and wherein the electrical connection portions connect between the at least one semiconductor device and the package support; and wherein the silicon carbide (SiC) integrated passive device (IPD) is between the package support and the at least one semiconductor device.

25. The package according to claim 24 wherein the at least one semiconductor device is configured as a flip chip; and wherein the electrical connection portions are further between the at least one semiconductor device and the silicon carbide (SiC) integrated passive device (IPD).

26. The package according to claim 24 further comprising an over-mold configured to at least partially surround the at least one semiconductor device.

27. A package comprising:

at least one semiconductor device;

a package support configured to support the at least one semiconductor device;

a silicon carbide (SiC) integrated passive device (IPD);

a heat sink on the at least one semiconductor device; and electrical connection portions configured and/or operable to connect between the at least one semiconductor device and the package support;

wherein the electrical connection portions are between the at least one semiconductor device and the silicon carbide (SiC) integrated passive device (IPD); and wherein the silicon carbide (SiC) integrated passive device (IPD) is between the package support and the at least one semiconductor device.

28. The package according to claim 27 wherein the at least one semiconductor device is configured as a flip chip; and wherein the electrical connection portions further connect between the at least one semiconductor device and the package support.

29. The package according to claim 27 further comprising an over-mold configured to at least partially surround the at least one semiconductor device.

* * * * *